United States Patent
Sakamoto

(10) Patent No.: US 10,777,753 B2
(45) Date of Patent: Sep. 15, 2020

(54) HETEROCYCLIC COMPOUND AND ORGANIC ELECTROLUMINESCENCE DEVICE INCLUDING THE SAME

(71) Applicant: Samsung Display Co., Ltd., Yongin-si, Gyeonggi-do (KR)

(72) Inventor: Naoya Sakamoto, Tsurumi-ku (JP)

(73) Assignee: Samsung Display Co., Ltd., Yongin-si (KR)

( * ) Notice: Subject to any disclaimer, the term of this patent is extended or adjusted under 35 U.S.C. 154(b) by 388 days.

(21) Appl. No.: 15/905,554

(22) Filed: Feb. 26, 2018

(65) Prior Publication Data

US 2019/0019965 A1    Jan. 17, 2019

(30) Foreign Application Priority Data

Jul. 12, 2017    (KR) .................. 10-2017-0088675

(51) Int. Cl.
  *H01L 51/50*    (2006.01)
  *H01L 51/00*    (2006.01)
  (Continued)

(52) U.S. Cl.
  CPC ........ *H01L 51/0094* (2013.01); *C07F 7/0816* (2013.01); *C07F 9/6596* (2013.01);
  (Continued)

(58) Field of Classification Search
  None
  See application file for complete search history.

(56) References Cited

U.S. PATENT DOCUMENTS

2015/0162542 A1    6/2015    Ryu et al.
2015/0318501 A1*   11/2015   Watanabe ........... H01L 51/0058
                                                        257/40

FOREIGN PATENT DOCUMENTS

JP    4048792 B2    2/2008
JP    2016-504754 A    2/2016
(Continued)

OTHER PUBLICATIONS

Han, C., et al., "Xanthene-based phosphine oxide host with the planar multi-insulating structure for efficient electrophosphorescence," Dyes and Pigments, 2012, vol. 94, pp. 561-569.
(Continued)

*Primary Examiner* — Gregory D Clark
(74) *Attorney, Agent, or Firm* — Lewis Roca Rothgerber Christie LLP

(57) ABSTRACT

A heterocyclic compound represented by the following Formula 1 and an organic electroluminescence device including the same are provided.

Formula 1

(Continued)

In Formula 1, $X_1$ and $X_2$ are each independently represented by any one of the following Formulae 2 to 4:

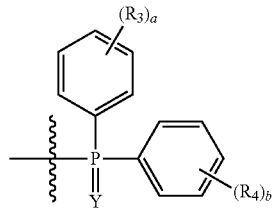

Formula 2

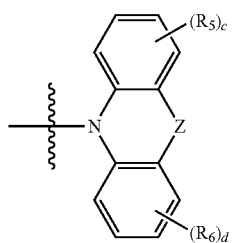

Formula 3

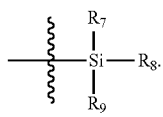

Formula 4

19 Claims, 2 Drawing Sheets

(51) Int. Cl.
  *C07F 7/08* (2006.01)
  *C07F 9/6596* (2006.01)
  *C09K 11/06* (2006.01)

(52) U.S. Cl.
  CPC .......... *C09K 11/06* (2013.01); *H01L 51/0071* (2013.01); *H01L 51/0072* (2013.01); *C09K 2211/1018* (2013.01); *C09K 2211/1022* (2013.01); *H01L 51/508* (2013.01); *H01L 51/5012* (2013.01); *H01L 51/5024* (2013.01); *H01L 51/5056* (2013.01); *H01L 51/5064* (2013.01); *H01L 51/5072* (2013.01); *H01L 51/5088* (2013.01); *H01L 51/5092* (2013.01); *H01L 51/5096* (2013.01)

(56) References Cited

FOREIGN PATENT DOCUMENTS

| | | |
|---|---|---|
| KR | 10-2014-0134884 A | 11/2014 |
| KR | 10-2015-0079960 A | 7/2015 |
| KR | 10-1769764 B1 | 8/2017 |
| WO | WO 2012/056966 A1 | 5/2012 |
| WO | WO 2014/072320 A1 | 5/2014 |
| WO | WO 2015/080182 A1 | 6/2015 |

OTHER PUBLICATIONS

Rajesh, K., et al., "Homogeneous Hydrogenations of Nitriles Catalyzed by Rhenium Complexes," Communications: Adv. Synth. Catal., 2011, vol. 353, pp. 1479-1484.

EPO Extended Search Report dated Jul. 13, 2018, for corresponding European Patent Application No. 18169914.1 (7 pages).

Li, Jing et al., "A "Si-Locked" Phosphine Oxide Host with Suppressed Structural Relaxation for Highly Efficient Deep-Blue TADF Diodes", Advanced Optical Materials, 2016, pp. 522-528, vol. 4.

* cited by examiner

HETEROCYCLIC COMPOUND AND ORGANIC ELECTROLUMINESCENCE DEVICE INCLUDING THE SAME

CROSS-REFERENCE TO RELATED APPLICATIONS

This application claims priority to and the benefit of Korean Patent Application No. 10-2017-0088675, filed on Jul. 12, 2017, the entire content of which is incorporated herein by reference.

BACKGROUND

1. Field

The present disclosure herein relates to a heterocyclic compound and an organic electroluminescence device including the same.

2. Description of the Related Art

Development on an organic electroluminescence display as an image display is being actively conducted. An organic electroluminescence display is different from a liquid crystal display and is a self-luminescent display. It accomplishes display by recombining holes and electrons injected from a first electrode and a second electrode in an emission layer and emitting light from a luminescent material, which is an organic compound included in the emission layer.

As a related art organic electroluminescence device, for example, an organic device includes a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light during the transition of the excitons back to a ground state. In addition, the configuration of an organic electroluminescence device is not limited to those described above, and various suitable modifications may be possible.

SUMMARY

Aspects according to one or more embodiments of the present disclosure are directed toward a heterocyclic compound and an organic electroluminescence device including the same.

According to an embodiment of the present disclosure, a heterocyclic compound is represented by the following Formula 1:

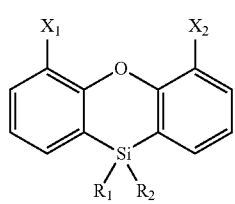

Formula 1

In Formula 1, $R_1$ and $R_2$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring; and $X_1$ and $X_2$ are each independently represented by any one of the following Formulae 2 to 4:

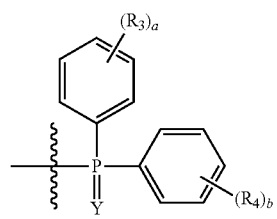

Formula 2

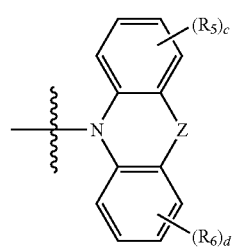

Formula 3

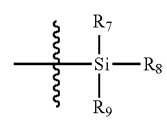

Formula 4

In Formula 2, Y is O or S. In Formula 3, Z is a direct linkage, $CR_{10}R_{11}$, or $SiR_{12}R_{13}$. In Formulae 2 to 4, $R_3$ to $R_{13}$ are each independently hydrogen, deuterium, a halogen atom, a cyano group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring; a and b are each independently an integer of 0 to 5; and c and d are each independently an integer of 0 to 4.

In an embodiment, $R_1$ and $R_2$ may be the same as each other.

In an embodiment, $R_1$ and $R_2$ may be each independently a substituted or unsubstituted alkyl group having 1 to 6 carbon atoms, or a substituted or unsubstituted phenyl group.

In an embodiment, $X_1$ and $X_2$ may be the same as each other.

In an embodiment, $X_1$ and $X_2$ may be each independently represented by the above Formula 2.

In an embodiment, $X_1$ and $X_2$ may be each independently represented by any one of the following Formulae 3-1 to 3-5:

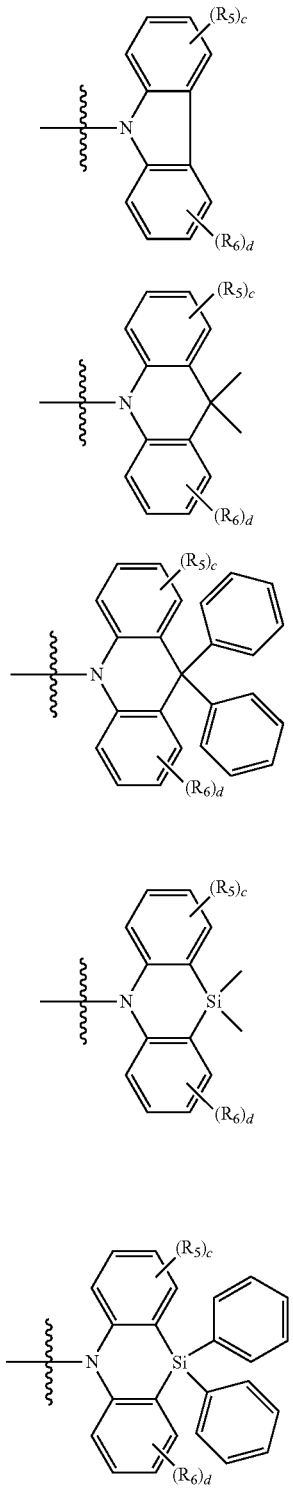

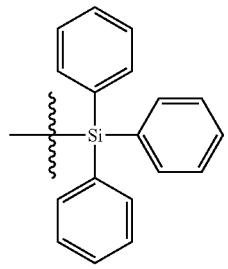

Formula 4-1

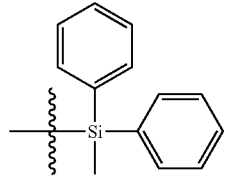

Formula 4-2

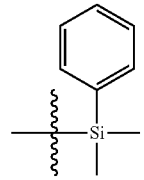

Formula 4-3

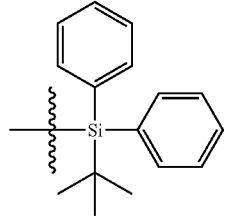

Formula 4-4

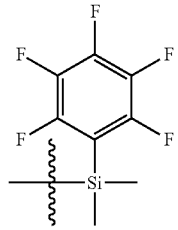

Formula 4-5

In Formulae 3-1 to 3-5, $R_5$, $R_6$, c and d are the same as defined above.

In an embodiment, $X_1$ and $X_2$ may be each independently represented by any one of the following Formulae 4-1 to 4-5:

According to an embodiment of the present disclosure, an organic electroluminescence device includes a first electrode, a hole transport region on the first electrode, an emission layer on the hole transport region, an electron transport region on the emission layer, and a second electrode on the electron transport region, wherein at least one of the hole transport region, the emission layer, or the electron transport region includes a heterocyclic compound according to an embodiment of the present disclosure. The first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof.

In an embodiment, the emission layer may include the heterocyclic compound according to an embodiment of the present disclosure.

In an embodiment, the hole transport region may include a plurality of layers, and a layer of the plurality of layers contacting with the emission layer may include the heterocyclic compound according to an embodiment of the present disclosure.

In an embodiment, the electron transport region may include a plurality of layers, and a layer of the plurality of layers contacting with the emission layer may include the heterocyclic compound according to an embodiment of the present disclosure.

BRIEF DESCRIPTION OF THE FIGURES

The accompanying drawings are included to provide a clear understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
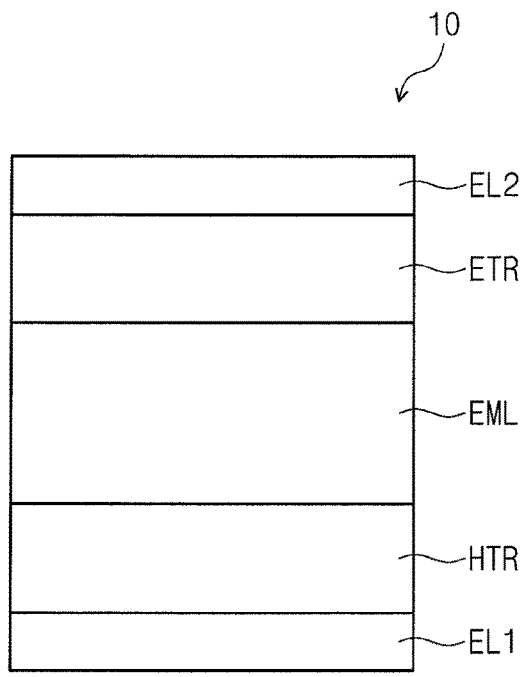
FIG. 1 is a schematic cross-sectional view of an organic electroluminescence device according to an embodiment of the present disclosure.

The above objects, other objects, features and enhancements of the present disclosure will be easily understood from preferred exemplary embodiments with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

Like reference numerals refer to like elements for explaining each drawing. In the drawings, the sizes of elements may be enlarged for clarity of the present disclosure. It will be understood that, although the terms first, second, etc., may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc., is referred to as being "on" or "under" another part, it can be directly on or under the other part, or intervening layers may also be present.

In the present disclosure,

represents a part to be connected.

In the present disclosure, the term "substituted" may refer to a functional group in which at least one hydrogen atom is substituted with at least one substituent selected from deuterium, a halogen atom, a cyano group, a nitro group, an amino group, a silyl group, a boron atom, a phosphine oxide group, a phosphine sulfide group, an alkyl group, an alkenyl group, an aryl group and a heterocyclic group. In addition, each of the substituent illustrated above may be substituted or unsubstituted. For example, biphenyl may be interpreted as aryl, or phenyl substituted with phenyl. The term "unsubstituted" may refer to a functional group in which none of its hydrogen atom is substituted with a different atom or group.

In the present disclosure, "forming a ring by combining adjacent groups with each other" may refer to the forming of a substituted or unsubstituted hydrocarbon ring or a substituted or unsubstituted heterocyclic group by combining adjacent groups with each other. The hydrocarbon ring may include an aliphatic hydrocarbon ring and/or an aromatic hydrocarbon ring. The heterocyclic group may include an aliphatic heterocyclic group and/or an aromatic heterocyclic group. The hydrocarbon ring and heterocyclic group may be a monocycle or polycycle. In addition, the ring formed by combining adjacent groups with each other may be connected with another ring to form a Spiro structure.

In the present disclosure, examples of a halogen atom are a fluorine atom, a chlorine atom, a bromine atom, and/or an iodine atom.

In the present disclosure, the alkyl group may have a linear, branched or cyclic form. The carbon number of the alkyl group may be 1 to 30, 1 to 20, 1 to 10, or 1 to 6. Non-limiting examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc.

In the present disclosure, the term "aryl group" may refer to any functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Non-limiting examples of the aryl group may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc.

In the present disclosure, the fluorenyl group may be substituted, and two substituents may be combined with each other to form a Spiro structure. Non-limiting examples of the substituted fluorenyl group may include the following groups:

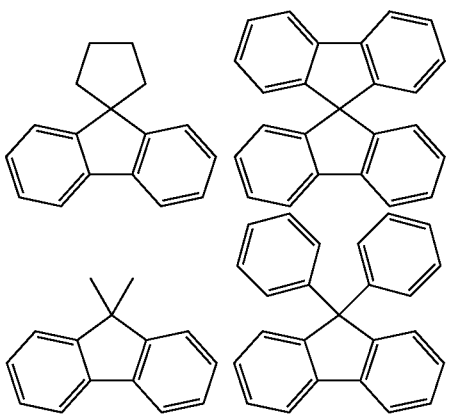

In the present disclosure, the term "heteroaryl group" may refer to a heteroaryl group including at least one of O, N, P, Si, or S as a heteroatom. When the heteroaryl group includes two heteroatoms, the two heteroatoms may be the same or different from each other. The carbon number of the heteroaryl group for forming a ring may be 2 to 30, or 2 to 20. The heteroaryl group may be monocyclic heteroaryl or polycyclic heteroaryl. Polycyclic heteroaryl may have bicyclic or tricyclic structure, for example. Non-limiting examples of the heteroaryl group may include thiophenyl, furanyl, pyrrolyle, imidazolyle, thiazole, oxazolyle, oxadiazole, triazolyle, pyridyl, bipyridyl, pyrimidyl, triazinyle, triazole, acridyl, pyridazinyle, pyrazinyl, quinolinyl, quinazolinyle, quinoxalinyl, phenoxazinyl, phthalazinyl, pyrido pyrimidinyl, pyrido pyrazinyl, pyrazino pyrazinyl, isoquinolinyle, indolyle, carbazolyle, N-arylcarbazolyle, N-heteroaryl carbazolyle, N-alkyl carbazolyle, benzoxazolyle, benzoimidazolyle, benzothiazole, benzocarbazolyle, benzothiophenyle, dibenzothiophenyle, thienothiophenyle, benzofuranyl, phenanthrolinyle, thiazolyl, isooxazolyl, oxadiazolyl, thiadiazolyl, benzothiazolyl, phenothiazinyl, dibenzofuranyl, etc.

In the present disclosure, the silyl group may include alkyl silyl and/or aryl silyl. Non-limiting examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc.

In the present disclosure, the boron group may include alkyl boryl and/or aryl boron. Non-limiting examples of the boron group may include trimethyl boron, triethyl boron, t-butyl dimethyl boron, triphenyl boron, diphenyl boron, phenyl boron, etc.

In the present disclosure, the alkenyl group may be linear or branched. The carbon number is not specifically limited, and may be 2 to 30, 2 to 20, or 2 to 10. Non-limiting examples of the alkenyl group may include vinyl, 1-butenyl, 1-pentenyl, 1,3-butadienyl, styrenyl, styrylvinyl, etc.

In the present disclosure, the carbon number of the amino group is not specifically limited, and may be 1 to 30. The amino group may include alkyl amino and aryl amino, Non-limiting examples of the amino group may include methylamino, dimethylamino, phenylamino, diphenylamino, naphthylamino, 9-methyl-anthracenylamino, triphenylamino, etc.

In the present disclosure, the term "a direct linkage" may refer to a single bond.

Hereinafter, the heterocyclic compound according to an embodiment of the present disclosure will be explained.

The heterocyclic compound according to an embodiment of the present disclosure is represented by the following Formula 1:

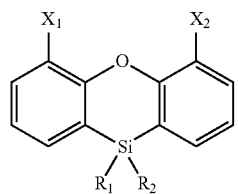

Formula 1

In Formula 1, $R_1$ and $R_2$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring.

In Formula 1, $X_1$ and $X_2$ are each independently represented by any one of the following Formulae 2 to 4:

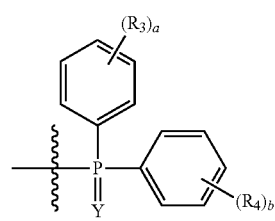

Formula 2

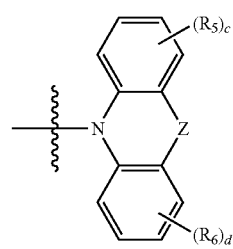

Formula 3

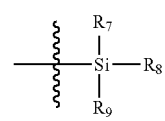

Formula 4

In Formula 2, Y is O or S, and a and b are each independently an integer of 0 to 5.

When a is an integer of 2 or more, a plurality of $R_3$s may be the same or different from each other. When b is an integer of 2 or more, a plurality of $R_4$s may be the same or different from each other. In one embodiment, a and b may each be 0. An embodiment of the present disclosure is not limited thereto, however, and a+b may be 1 or more.

In Formula 3, Z is a direct linkage, $CR_{10}R_{11}$, or $SiR_{12}R_{13}$, and c and d are each independently an integer of 0 to 4. In Formula 3, when Z is a direct linkage, Formula 3 is a carbazole moiety.

When c is an integer of 2 or more, a plurality of $R_5$s may be the same or different from each other. When d is an integer of 2 or more, a plurality of $R_6$s may be the same or different from each other. In one embodiment, c and d may each be 0. An embodiment of the present disclosure is not limited thereto, however, and c+d may be 1 or more.

In Formulae 2 to 4, $R_3$ to $R_{13}$ are each independently hydrogen, deuterium, a halogen atom, a cyano group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring.

In Formula 3, $R_{10}$ to $R_{13}$ may be each independently a substituted or unsubstituted alkyl group having 1 to 10 carbon atoms, or a substituted or unsubstituted aryl group having 6 to 20 carbon atoms for forming a ring. $R_{10}$ and $R_{11}$ may be the same as each other. $R_{12}$ and $R_{13}$ may be the same as each other.

In Formula 4, $R_7$ to $R_9$ may be each independently a substituted or unsubstituted alkyl group having 1 to 10 carbon atoms, or a substituted or unsubstituted aryl group having 6 to 20 carbon atoms for forming a ring. $R_7$ to $R_9$ may be each independently a substituted or unsubstituted methyl group, a substituted or unsubstituted ethyl group, a substituted or unsubstituted propyl group, a substituted or unsubstituted butyl group, or a substituted or unsubstituted phenyl group.

In Formula 4, at least one of $R_7$ to $R_9$ may be a substituted or unsubstituted aryl group having 6 to 30 carbon atoms for forming a ring. For example, at least one of $R_7$ to $R_9$ may be a phenyl group, which is unsubstituted or substituted with one or more halogen atoms.

$R_1$ and $R_2$ may be the same as each other. However, an embodiment of the present disclosure is not limited thereto.

$R_1$ and $R_2$ may be each independently a substituted or unsubstituted alkyl group having 1 to 6 carbon atoms, or a substituted or unsubstituted phenyl group. For example, $R_1$ and $R_2$ may be each independently a substituted or unsubstituted methyl group, or a substituted or unsubstituted butyl group. For example, $R_1$ and $R_2$ may be each independently a substituted or unsubstituted phenyl group. For example, $R_1$ and $R_2$ may be each independently a phenyl group, which is unsubstituted or substituted with an alkyl group.

$X_1$ and $X_2$ may be the same as each other. However, an embodiment of the present disclosure is not limited thereto.

$X_1$ and $X_2$ may be each independently represented by Formula 2. An embodiment of the present disclosure is not limited thereto, however, and $X_1$ and $X_2$ may be each independently represented by Formula 3. For example, $X_1$ and $X_2$ may be each independently represented by any one of the following Formulae 3-1 to 3-5:

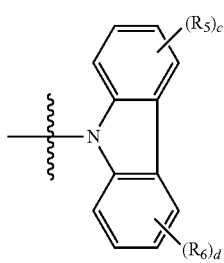

Formula 3-1

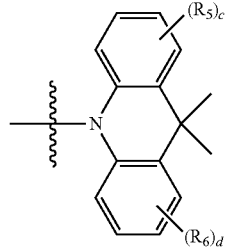

Formula 3-2

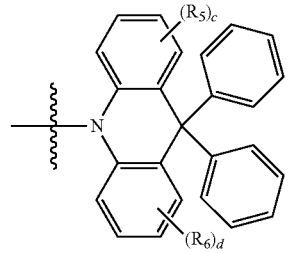

Formula 3-3

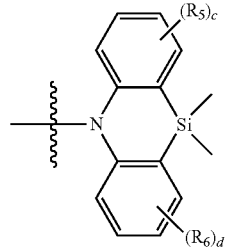

Formula 3-4

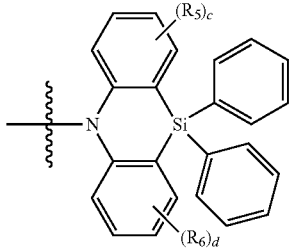

Formula 3-5

In Formulae 3-1 to 3-5, $R_5$, $R_6$, c and d are the same as defined above.

In another embodiment, $X_1$ and $X_2$ may be each independently represented by Formula 4. For example, $X_1$ and $X_2$ may be each independently represented by any one of the following Formulae 4-1 to 4-5:

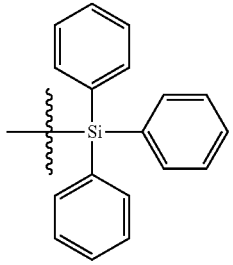

Formula 4-1

-continued
Formula 4-2
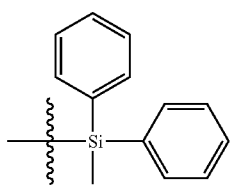
Formula 4-3
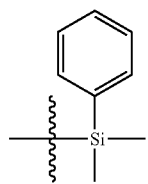
Formula 4-4
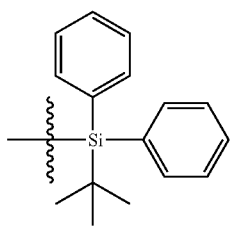
Formula 4-5
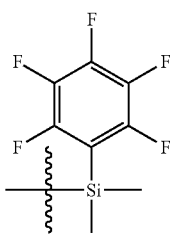
The heterocyclic compound represented by Formula 1 according to an embodiment of the present disclosure may be any one, selected from the compounds represented in the following Compound Group 1. However, an embodiment of the present disclosure is not limited thereto.
Compound Group 1
1
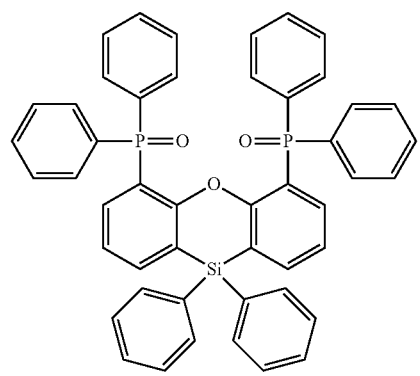
-continued
2
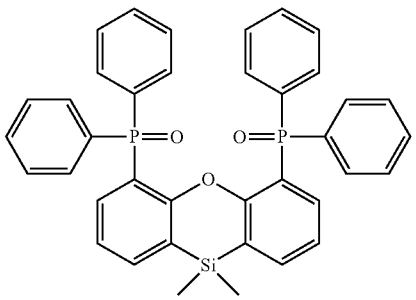
3
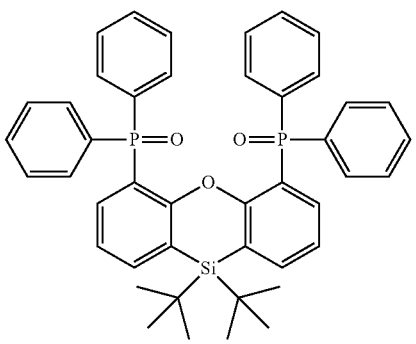
4
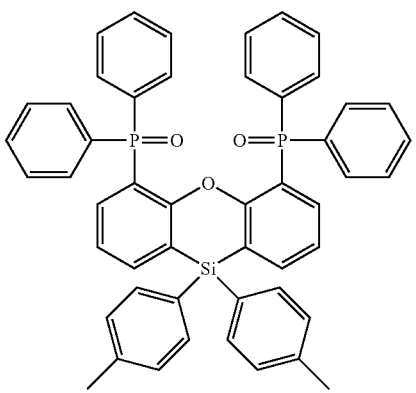
5
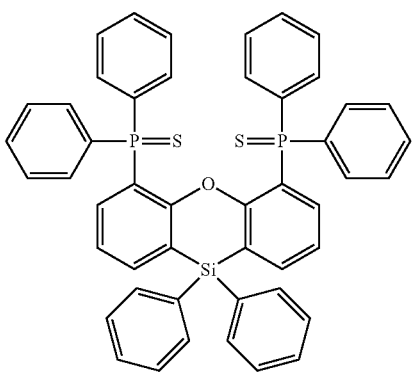

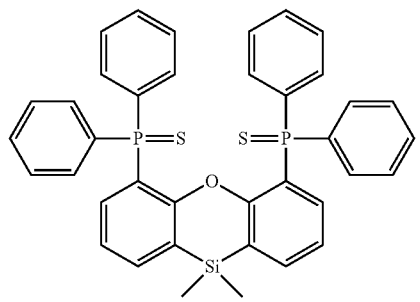
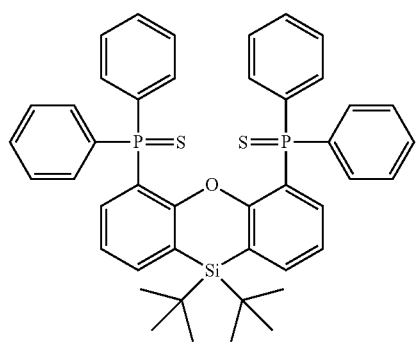
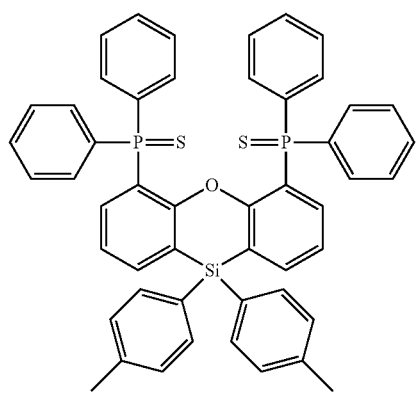
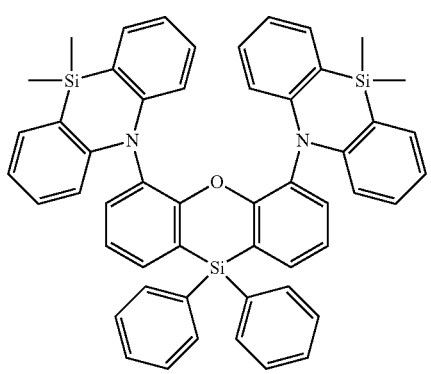
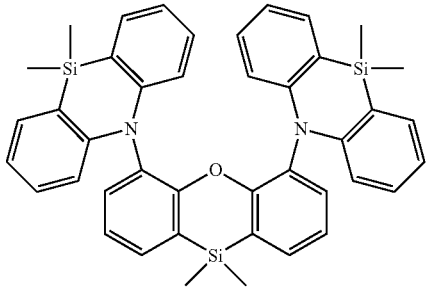
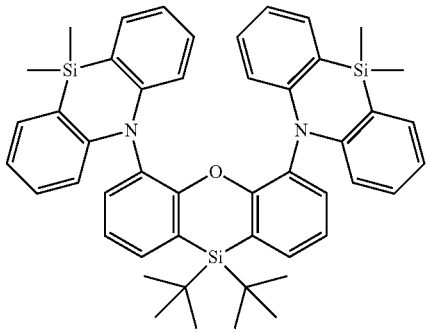
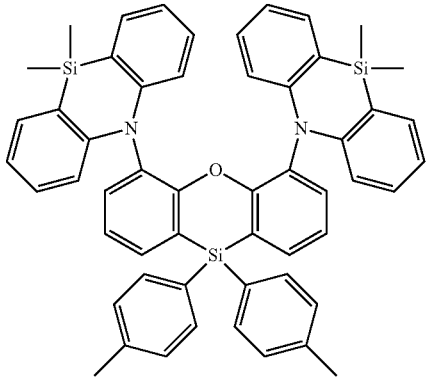
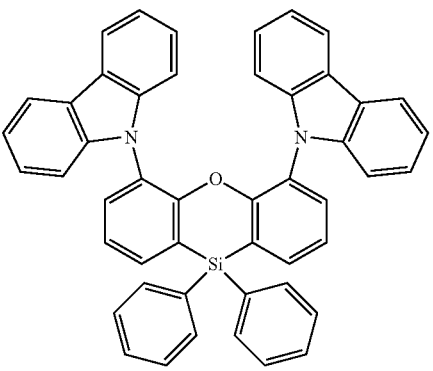

14
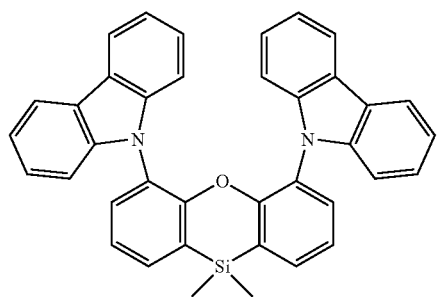
15
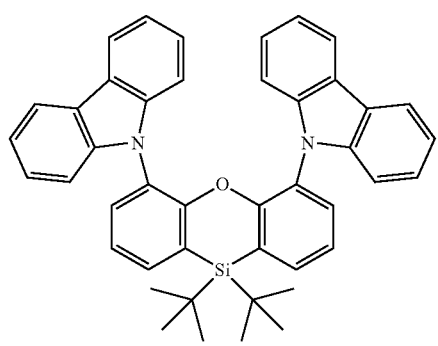
16
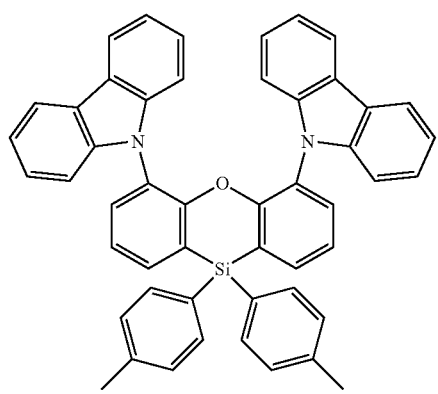
17
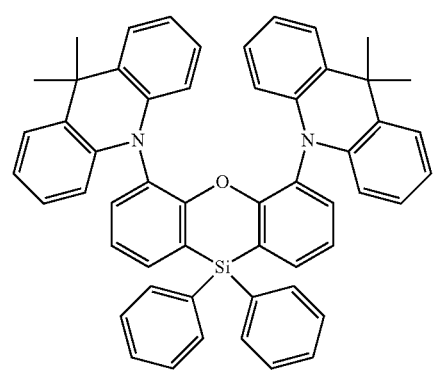
18
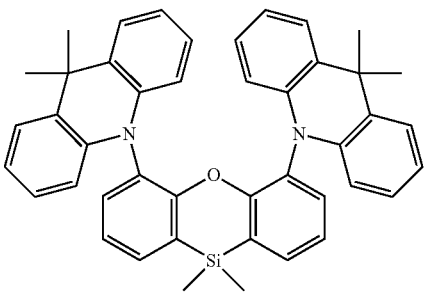
19
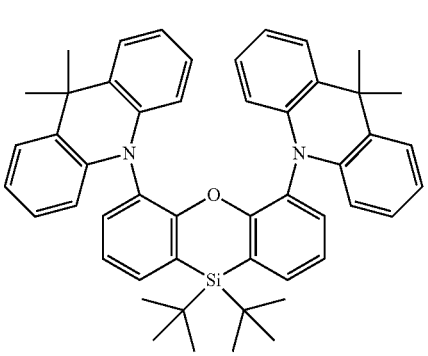
20
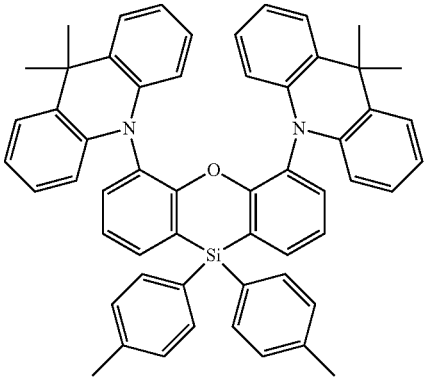
21
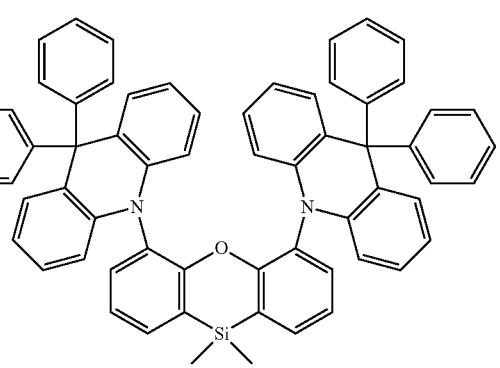

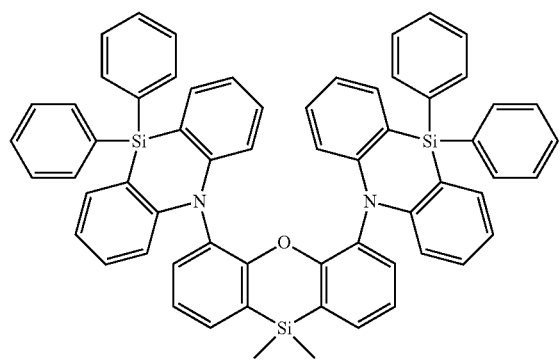
22
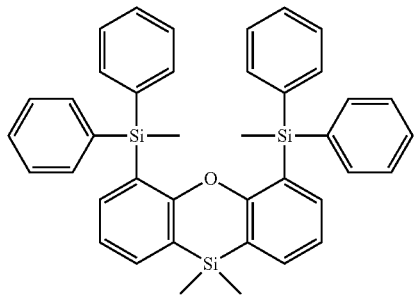
26
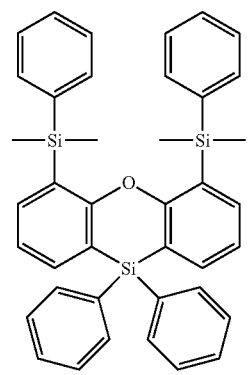
27
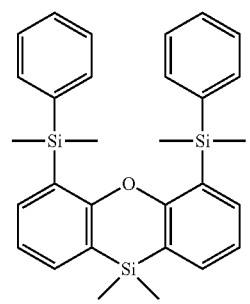
28
23
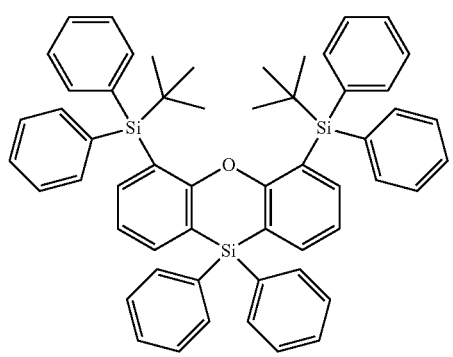
29
24
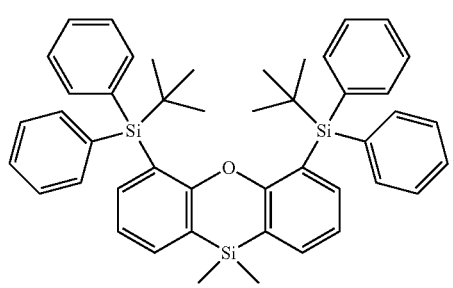
30
25

-continued

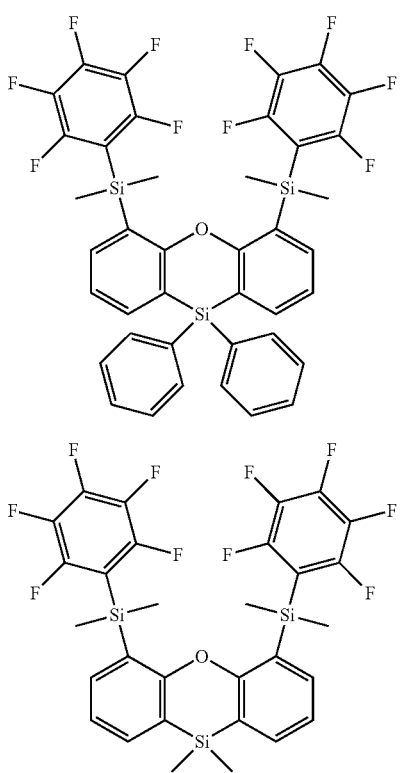

The heterocyclic compound according to an embodiment of the present disclosure has a core structure of dibenzooxasiline. A substituent is introduced only into an ortho position of the oxygen atom in dibenzooxasiline, and no substituent is introduced into other positions, which does not decrease the stability of dibenzooxasiline, thereby attaining high efficiency and long life effect of an organic electroluminescence device including the heterocyclic compound according to an embodiment of the present disclosure.

The heterocyclic compound according to an embodiment of the present disclosure may be utilized as a material for an organic electroluminescence device. For example, the heterocyclic compound according to an embodiment of the present disclosure may be utilized as an emission material, a hole transport material, an electron transport material, etc. For example, the heterocyclic compound according to an embodiment of the present disclosure may be utilized as a material for a thermally activated delayed fluorescence device.

Hereinafter, an organic electroluminescence device according to an embodiment of the inventive step will be explained. The explanation will be mainly given with features different from the heterocyclic compound according to an embodiment of the present disclosure, and unexplained parts will follow the above-description on the heterocyclic compound according to an embodiment of the present disclosure.

An organic electroluminescence device according to an embodiment of the present disclosure includes the above-described heterocyclic compound according to an embodiment of the present disclosure.

Figure 2:
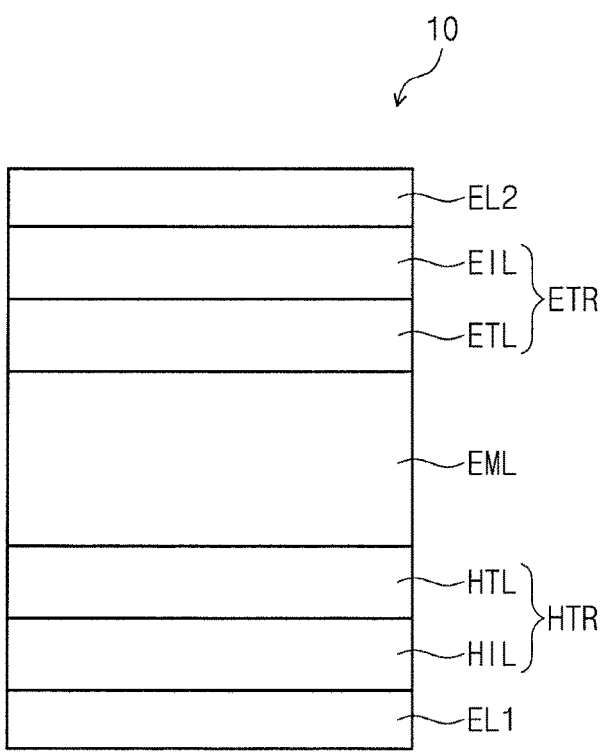
FIG. 2 is a schematic cross-sectional view of an organic electroluminescence device according to an embodiment of the present disclosure.
Figure 3:
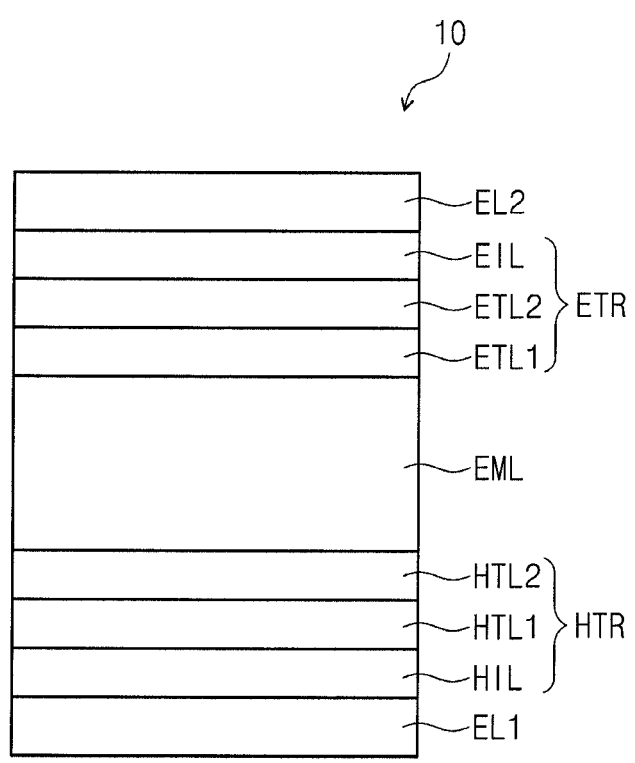
FIG. 3 is a schematic cross-sectional view of an organic electroluminescence device according to an embodiment of the present disclosure.

FIG. 1 is a schematic cross-sectional view illustrating an organic electroluminescence device according to an embodiment of the present disclosure. FIG. 2 is a schematic cross-sectional view illustrating an organic electroluminescence device according to an embodiment of the present disclosure. FIG. 3 is a schematic cross-sectional view illustrating an organic electroluminescence device according to an embodiment of the present disclosure.

Referring to FIGS. 1 to 3, an organic electroluminescence device 10 according to an embodiment of the present disclosure includes a first electrode EL1, a hole transport region HTR, an emission layer EML, an electron transport region ETR, and a second electrode EL2. At least one of the hole transport region HTR, the emission layer EML, or the electron transport region ETR includes the heterocyclic compound according to an embodiment of the present disclosure. Specifically, at least one of the hole transport region HTR, the emission layer EML, or the electron transport region ETR may include the heterocyclic compound represented by the following Formula 1.

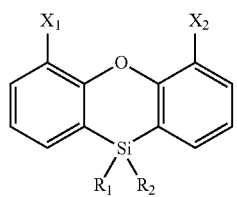

Formula 1

In Formula 1, particular explanation on $X_1$, $X_2$, $R_1$ and $R_2$ is the same as described above, and will be not be repeated again.

The first electrode EL1 has electrical conductivity. The first electrode EL1 may be a pixel electrode or an anode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed utilizing the above materials, and a transparent conductive layer formed utilizing ITO, IZO, ZnO, or ITZO. For example, the first electrode EL1 may have a trilayer structure of ITO/Ag/ITO. However, an embodiment of the present disclosure is not limited thereto.

The thickness of the first electrode EL1 may be from about 1,000 Å to about 10,000 Å, for example, from about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer. The thickness of the hole transport region HTR may be from about 100 Å to about 1,500 Å, for example.

The hole transport region HTR may include the heterocyclic compound according to an embodiment of the present disclosure.

The hole transport region HTR may be a single layer formed utilizing a single material, a single layer formed utilizing a plurality of different materials, or may have a multilayer structure including a plurality of layers formed utilizing a plurality of different materials.

For example, the hole transport region HTR may have a single layer structure of a hole injection layer HIL or a hole transport layer HTL. In addition, the hole transport region HTR may have a single layer structure formed utilizing a plurality of different materials, for example, a single layer structure formed utilizing a hole injection material and a hole transport material; or a laminated structure of hole injection layer HIL/hole transport layer HTL, hole injection layer HIL/first hole transport layer HTL1/second hole transport layer HTL2, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, laminated in the stated order from the first electrode EL1. However, embodiments of the present disclosure are not limited thereto.

As described above, the hole transport region HTR may have a multilayer structure having a plurality of layers, and at least one layer of the plurality of layers may include the heterocyclic compound according to an embodiment of the present disclosure. For example, the hole transport region HTR may include a structure of a hole injection layer HIL disposed on the first electrode EL1, a first hole transport layer HTL1 disposed on the hole injection layer HIL, and a second hole transport layer HTL2 disposed on the first hole transport layer HTL1, and at least one of the first hole transport layer HTL1 or the second hole transport layer HTL2 may include the heterocyclic compound according to an embodiment of the present disclosure. Among the plurality of layers, a layer contacting (e.g., in direct contact) with the emission layer EML may include the heterocyclic compound according to an embodiment of the present disclosure. For example, the second hole transport layer HTL2 may include the heterocyclic compound according to an embodiment of the present disclosure.

The hole transport region HTR may be formed utilizing various suitable methods such as a vacuum deposition method, a spin coating method, a cast method, a Langmuir-Blodgett (LB) method, an inkjet printing method, a laser printing method, or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (α-NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, 1,3-bis(N-carbazolyl)benzene (mCP), carbazole derivatives (such as N-phenyl carbazole and polyvinyl carbazole), fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl) triphenylamine (TCTA), N,N'-di(1-naphthalen-1-yl)-N,N'-diphenyl-benzidine (α-NPD), 4,4'-cyclohexylidene bis[N, N-bis(4-methylphenyl)benzenamine] (TAPC), 4,4'-bis[N, N'-(3-tolyl)amino]-3,3'-dimethylbiphenyl (HMTPD), etc.

The thickness of the hole transport region HTR may be from about 100 Å to about 10,000 Å, for example, from about 100 Å to about 1,000 Å. When the hole transport region HTR includes both the hole injection layer HIL and the hole transport layer HTL, the thickness of the hole injection layer HIL may be, for example, from about 100 Å to about 1,000 Å, and the thickness of the hole transport layer HTL may be from about 30 Å to about 1,000 Å. The hole transport layer HTL may have a single layer structure, or a multilayer structure including the first hole transport layer HTL1 and the second hole transport layer HTL2. When the thicknesses of the hole transport region HTR, the hole injection layer HIL and the hole transport layer HTL satisfy the above-described ranges, satisfactory hole transport properties may be obtained without a substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without being limited thereto. For example, non-limiting examples of the p-dopant may include quinone derivatives (such as tetracyanoquinodimethane (TCNQ), or 2,3,5,6-tetrafluoro-tetracyanoquinodimethane (F4-TCNQ)), and metal oxides (such as tungsten oxide or molybdenum oxide).

As described above, the hole transport region HTR may further include at least one of a hole buffer layer or an electron blocking layer in addition to the hole injection layer HIL and/or the hole transport layer HTL. The hole buffer layer may compensate an optical resonance distance according to the wavelength of light emitted from the emission layer EML and increase the light emission efficiency. Materials included in the hole transport region HTR may be utilized as materials included in the hole buffer layer. The electron blocking layer is a layer reducing or preventing electron injection from the electron transport region ETR into the hole transport region HTR.

The emission layer EML is disposed on the hole transport region HTR. The thickness of the emission layer EML may be, for example, from about 100 Å to about 300 Å. The emission layer EML may be a single layer formed utilizing a single material, a single layer formed utilizing a plurality of different materials, or may have a multilayer structure having a plurality of layers formed utilizing a plurality of different materials.

The emission layer EML may include the above-described heterocyclic compound according to an embodiment of the present disclosure.

The emission layer EML may include one or more of the heterocyclic compound represented by Formula 1. The emission layer EML may further include a suitable material in addition to the heterocyclic compound represented by Formula 1. For example, the emission layer EML may include a fluorescent material including any one selected from spiro-DPVBi, 2,2',7,7'-tetrakis(biphenyl-4-yl)-9,9'-spirobifluorene(spiro-sexiphenyl) (spiro-6P), distyryl-benzene (DSB), distyryl-arylene (DSA), polyfluorene (PFO)-based polymer and poly(p-phenylene vinylene) (PPV)-based polymer, without being limited thereto.

The emission layer EML may include a host and a dopant, and the host may include the heterocyclic compound according to an embodiment of the present disclosure.

The emission layer EML including the heterocyclic compound according to an embodiment of the present disclosure may emit thermally activated delayed fluorescence. However, an embodiment of the present disclosure is not limited thereto.

The emission layer may further include a host. The host may be any suitable material commonly utilized without specific limitation and may include, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N-phenyl-benzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc.

The emission layer may further include a dopant. The dopant may be any suitable material commonly utilized without specific limitation and may include, for example, 10-phenyl-10H,10'H-spiro[acridine-9,9'-anthracen]-10'-one (ACRSA), 9,9'-(sulfonylbis(4,1-phenylene))bis(3,6-di-tert-butyl-9H-carbazole), 10,10'-((4-phenyl-4H-1,2,4-triazole-3,5-diyl)bis(4,1-phenylene))bis(10H-phenoxazine), bis(4-(9H-[3,9'-bicarbazol]-9-yl)phenyl)methanone, 10,10'-(sulfonylbis(4,1-phenylene))bis(9,9-dimethyl-9,10-dihydroacridine), 9'-(4-(4,6-diphenyl-1,3,5-triazin-2-yl)phenyl)-3,3'',6,6''-tetraphenyl-9'H-9,3':6',9''-tercarbazole, 9'-(4-(4,6-diphenyl-1,3,5-triazin-2-yl)phenyl)-9'H-9,3':6',9''-tercarbazole, 9,9'-(5-(4,6-diphenyl-1,3,5-triazin-2-yl)-1,3-phenylene)bis(9H-carbazole), 9,9',9'',9'''-((6-phenyl-1,3,5-triazine-2,4-diyl)bis(benzene-5,3,1-triyl))tetrakis(9H-carbazole), 9,9'-(sulfonylbis(4,1-phenylene))bis(3,6-dimethoxy-9H-carbazole), 9-(4-(4,6-diphenyl-1,3,5-triazin-2-yl)phenyl)-9H-carbazole, 5,9-diphenyl-5,9-dihydro-5,9-diaza-13b-boranaphtho[3,2,1-de]anthracene, 10-(4-(4,6-diphenyl-1,3,5-triazin-2-yl)phenyl)-9,9-dimethyl-9,10-dihydroacridine, or 2,6-di(9H-carbazol-9-yl)-4-phenylpyridine-3,5-dicarbonitrile), etc.

The thickness of the emission layer EML may be from about 100 Å to about 1,000 Å.

The electron transport region ETR is provided on the emission layer EML. The electron transport region ETR may include at least one of a hole blocking layer, an electron transport layer ETL or an electron injection layer EIL, without being limited thereto.

The electron transport region ETR may include the above-described heterocyclic compound according to an embodiment of the present disclosure.

The electron transport region ETR may be a single layer formed utilizing a single material, a single layer formed utilizing a plurality of different materials, or may have a multilayer structure having a plurality of layers formed utilizing a plurality of different materials.

For example, the electron transport region ETR may have a single layer structure of an electron injection layer EIL or an electron transport layer ETL. In addition, the electron transport region ETR may have a single layer structure having a plurality of different materials, for example, the electron transport region ETR may have a single layer structure formed utilizing an electron injection material and an electron transport material; or a laminated structure of electron transport layer ETL/electron injection layer EIL, first electron transport layer ETL1/second electron transport layer ETL2/electron injection layer EIL, or hole blocking layer/electron transport layer ETL/electron injection layer EIL, laminated in the stated order from the emission layer EML, without being limited thereto. The thickness of the electron transport region ETR may be, for example, from about 1,000 Å to about 1,500 Å.

As described above, the electron transport region ETR may have a multilayer structure having a plurality of layers, and at least one layer of the plurality of layers may include the above-described heterocyclic compound according to an embodiment of the present disclosure. For example, the electron transport region ETR may include a first electron transport layer ETL1 disposed on the emission layer EML, a second electron transport layer ETL2 disposed on the first electron transport layer ETL1, and an electron injection layer EIL disposed on the second electron transport layer ETL2, and at least one of the first electron transport layer ETL1 or the second electron transport layer ETL2 may include the heterocyclic compound according to an embodiment of the present disclosure. Among the plurality of layers, a layer contacting (e.g., in direct contact) with the emission layer EML may include the heterocyclic compound according to an embodiment of the present disclosure. For example, the first electron transport layer ETL1 may include the heterocyclic compound according to an embodiment of the present disclosure.

The electron transport region ETR may be formed utilizing various suitable methods such as a vacuum deposition method, a spin coating method, a cast method, a Langmuir-Blodgett (LB) method, an inkjet printing method, a laser printing method, or a laser induced thermal imaging (LITI) method.

When the electron transport region ETR includes the electron transport layer ETL, the electron transport region ETR may include bis[2-(diphenylphosphino)phenyl]ether oxide (DPEPO), tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof, without being limited thereto.

The thickness of the electron transport layer ETL may be from about 100 Å to about 1,500 Å, for example, from about 150 Å to about 500 Å. The electron transport layer ETL may have a single layer structure, or a multilayer structure including the first electron transport layer ETL1 and the second electron transport layer ETL2. When the thickness of the electron transport layer ETL satisfies the above-described ranges, satisfactory electron transport properties may be obtained without a substantial increase of a driving voltage.

When the electron transport region ETR includes the electron injection layer EIL, the electron transport region ETR may utilize LiF, lithium quinolate (Liq), Li$_2$O, BaO, NaCl, CsF, a metal in lanthanoids (such as Yb), or metal halides (such as RbCl or RbI), without being limited thereto. The electron injection layer EIL may also be formed utilizing a mixture material of an electron transport material and an insulating organo metal salt. The organo metal salt may be a material having an energy band gap of about 4 eV or more. For example, the organo metal salt may include a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. When the thickness of the electron injection layer EIL satisfies the above described ranges, satisfactory electron injection properties may be obtained without a substantial increase of a driving voltage.

The electron transport region ETR may include a hole blocking layer, as described above. The hole blocking layer may include, for example, at least one of 2,9-dimethyl-4,7-diphenyl-1,10-phenanthroline (BCP), or 4,7-diphenyl-1,10-phenanthroline (Bphen), without being limited thereto.

The second electrode EL2 is disposed on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may be formed utilizing transparent metal oxides, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed utilizing the above-described materials and a transparent conductive layer formed utilizing ITO, IZO, ZnO, ITZO, etc.

Even not shown, the second electrode EL2 may be connected with an auxiliary electrode. When the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

When the organic electroluminescence device 10 is a top emission device, the first electrode EL1 may be a reflective electrode, and the second electrode EL2 may be a transmissive electrode or a transflective electrode. When the organic electroluminescence device 10 is a bottom emission device, the first electrode EL1 may be a transmissive electrode or a transflective electrode, and the second electrode EL2 may be a reflective electrode.

The organic electroluminescence device according to an embodiment of the present disclosure includes the heterocyclic compound represented by Formula 1, thereby securing a high efficiency and a long life.

Hereinafter, the present disclosure will be explained in more detail with reference to embodiments and comparative embodiments. The following embodiments are illustrated only for assisting the understanding of the present disclosure, and the scope of the present disclosure is not limited thereto.

SYNTHESIS EXAMPLES

The heterocyclic compounds according to an embodiment of the present disclosure may be synthesized, for example, as follows. However, the synthetic method of the heterocyclic compounds according to an embodiment of the present disclosure is not limited thereto.

1. Synthesis of Compound 1

Compound 1, the heterocyclic compounds according to an embodiment of the present disclosure, may be synthesized, for example, by the following reaction.

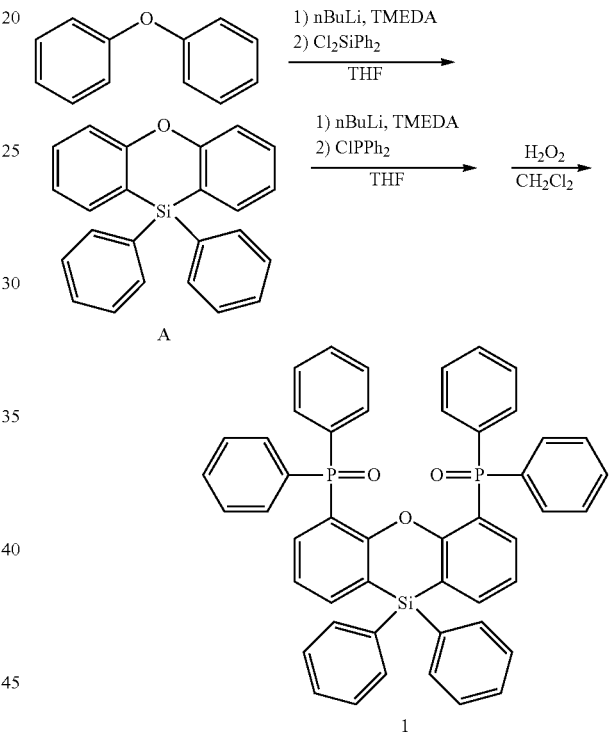

Under an argon (Ar) atmosphere, 5.0 g of diphenyl ether and 9.6 mL of N,N,N',N'-tetramethylethylenediamine (TMEDA) were dissolved in 200 mL of dehydrated THF in a 500 mL three neck flask, and n-BuLi (1.6 M in hexane, 40.4 mL) was added thereto dropwisely at 0° C. After stirring at room temperature for about 16 hours, 6.1 mL of diphenyldichlorosilane was added thereto dropwisely at 0° C., and the mixture was further stirred at room temperature for about 16 hours. After adding water to the reactant, the mixture was extracted with $CH_2Cl_2$. An organic layer was separated and dried over $MgSO_4$, and solvents were evaporated under reduced pressure. The crude product thus obtained was purified by silica gel column chromatography to obtain 5.6 g (yield 54%) of Compound A. The molecular weight of Compound A measured by FAB-MS was 350.

Under an argon (Ar) atmosphere, 5.0 g of Compound A and 4.9 mL of TMEDA were dissolved in 100 mL of dehydrated THF in a 500 mL three neck flask, and n-BuLi (1.6 M in hexane, 19.6 mL) was added thereto dropwisely at 0° C. After stirring at room temperature for about 16 hours, 5.8 mL of chlorodiphenylphosphine was added thereto dropwisely at 0° C., and the mixture was further stirred at room temperature for about 16 hours. After adding water to the reactant, the mixture was extracted with CH$_2$Cl$_2$. An organic layer was separated and dried over MgSO$_4$, and solvents were evaporated under reduced pressure. The crude product thus obtained was dissolved in 140 mL of CH$_2$Cl$_2$, and hydrogen peroxide (30%, 3 mL) was added thereto dropwisely at 0° C. After stirring at room temperature for about 3 hours, water and CH$_2$Cl$_2$ were added thereto. An organic layer was separated and dried with MgSO$_4$, and solvents were evaporated under reduced pressure. The crude product thus obtained was purified by recrystallization with toluene to obtain 5.3 g (yield 50%) of Compound 1. The molecular weight of Compound 1 measured by FAB-MS was 750.

2. Synthesis of Compound 2

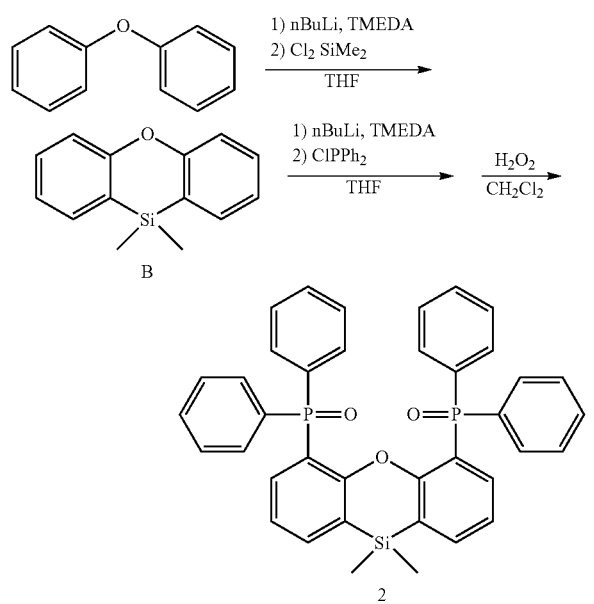

B

2

Under an argon (Ar) atmosphere, 5.0 g of diphenyl ether and 9.6 mL of TMEDA were dissolved in 200 mL of dehydrated THF in a 500 mL three neck flask, and n-BuLi (1.6 M in hexane, 40.4 mL) was added thereto dropwisely at 0° C. After stirring at room temperature for about 16 hours, 3.5 mL of dichlorodimethylsilane was added thereto dropwisely at 0° C., and the mixture was further stirred at room temperature for about 16 hours. After adding water to the reactant, the mixture was extracted with CH$_2$Cl$_2$. An organic layer was separated and dried over MgSO$_4$, and solvents were evaporated under reduced pressure. The crude product thus obtained was purified by silica gel column chromatography to obtain 3.7 g (yield 56%) of Compound B. The molecular weight of Compound B measured by FAB-MS was 226.

Under an argon (Ar) atmosphere, 4.0 g of Compound B and 5.8 mL of TMEDA were dissolved in 150 mL of dehydrated THF in a 500 mL three neck flask, and n-BuLi (1.6 M in hexane, 24.3 mL) was added thereto dropwisely at 0° C. After stirring at room temperature for about 16 hours, 8.2 mL of chlorodiphenylphosphine was added thereto dropwisely at 0° C., and the mixture was further stirred at room temperature for about 16 hours. After adding water to the reactant, the mixture was extracted with CH$_2$Cl$_2$. An organic layer was separated and dried over MgSO$_4$, and solvents were evaporated under reduced pressure. The crude product thus obtained was dissolved in 150 mL of CH$_2$Cl$_2$, and hydrogen peroxide (30%, 3.6 mL) was added thereto dropwisely at 0° C. After stirring at room temperature for about 3 hours, water and CH$_2$Cl$_2$ were added thereto. An organic layer was separated and dried with MgSO$_4$, and solvents were evaporated under reduced pressure. The crude product thus obtained was purified by recrystallization with toluene to obtain 5.5 g (yield 50%) of Compound 2. The molecular weight of Compound 2 measured by FAB-MS was 626.

3. Synthesis of Compound 5

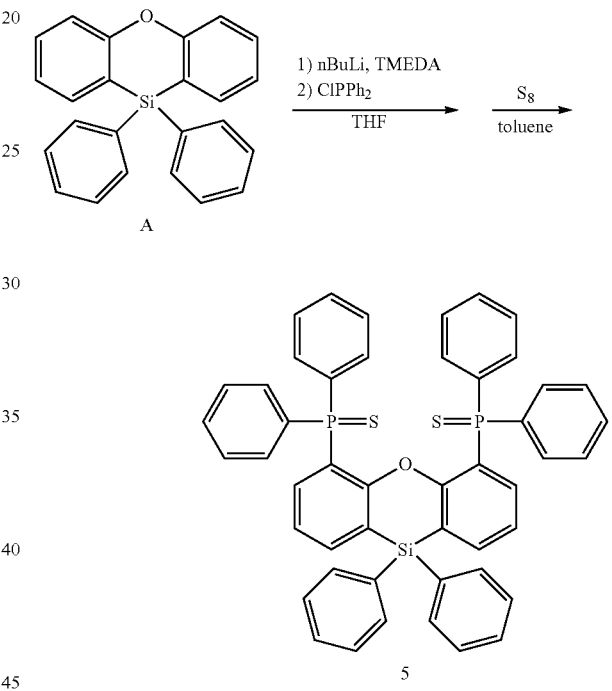

A

5

Under an argon (Ar) atmosphere, 5.0 g of Compound A and 4.9 mL of TMEDA were dissolved in 100 mL of dehydrated THF in a 500 mL three neck flask, and n-BuLi (1.6 M in hexane, 19.6 mL) was added thereto dropwisely at 0° C. After stirring at room temperature for about 16 hours, 5.8 mL of chlorodiphenylphosphine was added thereto dropwisely at 0° C., and the mixture was further stirred at room temperature for about 16 hours. After adding water to the reactant, the mixture was extracted with CH$_2$Cl$_2$. An organic layer was separated and dried over MgSO$_4$, and solvents were evaporated under reduced pressure. The crude product thus obtained was dissolved in 140 mL of toluene, and the resultant was filtered utilizing silica gel. After adding 0.9 g of sulfur thereto, the mixture was heated to reflux for about 8 hours. After adding water and CH$_2$Cl$_2$ thereto, an organic layer was separated and dried with MgSO$_4$, and solvents were evaporated under reduced pressure. The crude product thus obtained was purified by recrystallization with toluene to obtain 6.7 g (yield 60%) of Compound 5. The molecular weight of Compound 5 measured by FAB-MS was 782.

4. Synthesis of Compound 13

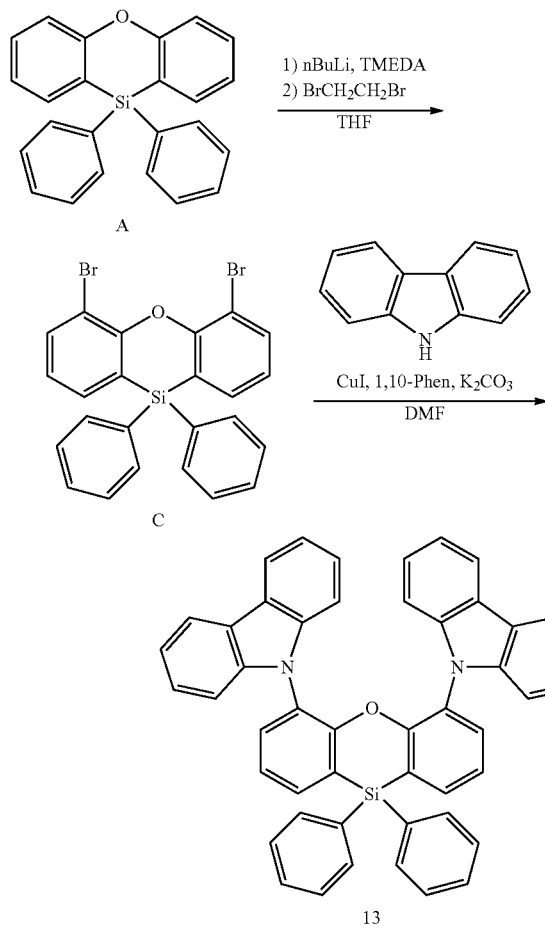

Under an argon (Ar) atmosphere, 5.0 g of Compound A and 4.9 mL of TMEDA were dissolved in 100 mL of dehydrated THF in a 500 mL three neck flask, and n-BuLi (1.6 M in hexane, 19.6 mL) was added thereto dropwisely at 0° C. After stirring at room temperature for about 16 hours, 3.7 mL of 1,2-dibromoethane was added thereto dropwisely at −78° C. The resultant was stirred for about 2 hours so that the temperature was elevated to room temperature, and then further stirred at room temperature for about 12 hours. After adding water to the reactant, the mixture was extracted. An organic layer was separated and dried over MgSO$_4$, and solvents were evaporated under reduced pressure. The crude product thus obtained was purified by silica gel column chromatography to obtain 3.7 g (yield 52%) of Compound C. The molecular weight of Compound C measured by FAB-MS was 508.

Under an argon (Ar) atmosphere, 3.5 g of Compound C, 2.3 g of carbazole, 0.13 g of CuI, 0.25 g of 1,10-phenanthroline and 3.8 g of K$_2$CO$_3$ were injected to a 500 mL three neck flask, and the mixture in 100 mL of DMF was heated and stirred at 100° C. for about 8 hours. After cooling in the air, the resultant was extracted with water and CH$_2$Cl$_2$. An organic layer was separated and dried with MgSO$_4$, and solvents were evaporated under reduced pressure. The crude product thus obtained was purified by silica gel column chromatography to obtain 2.8 g (yield 61%) of Compound 13. The molecular weight of Compound 13 measured by FAB-MS was 680.

5. Synthesis of Compound 17

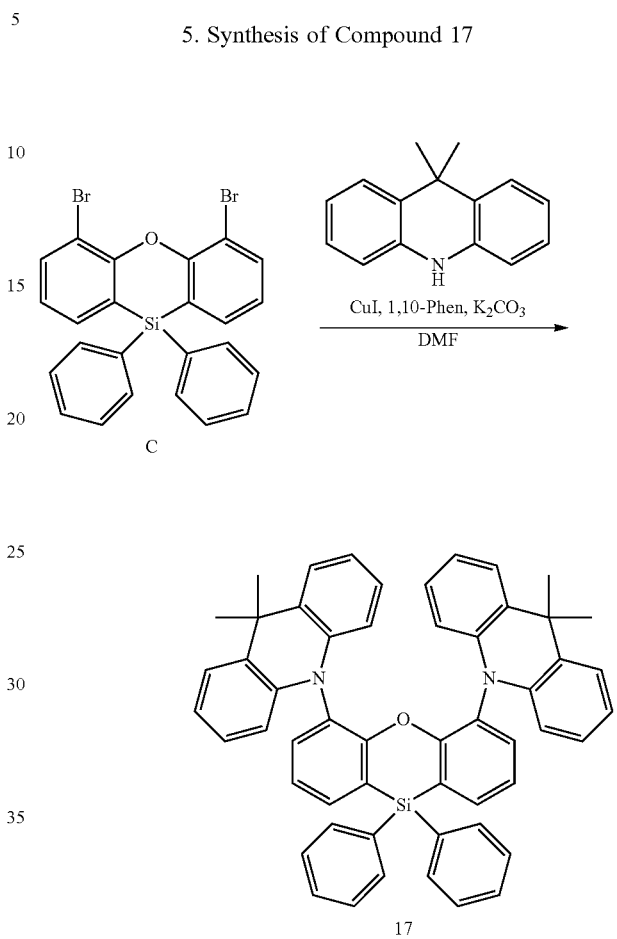

Under an argon (Ar) atmosphere, 3.5 g of Compound C, 2.9 g of 9,10-dihydro-9,9-dimethylacridine, 0.13 g of CuI, 0.25 g of 1,10-phenanthroline and 3.8 g of K$_2$CO$_3$ were injected to a 500 mL three neck flask, and the mixture in 100 mL of DMF was heated and stirred at 100° C. for about 10 hours. After cooling in the air, the resultant was added with water and CH$_2$Cl$_2$. An organic layer was separated and dried with MgSO$_4$, and solvents were evaporated under reduced pressure. The crude product thus obtained was purified by silica gel column chromatography to obtain 3.1 g (yield 60%) of Compound 17. The molecular weight of Compound 17 measured by FAB-MS was 765.

6. Synthesis of Compound 22

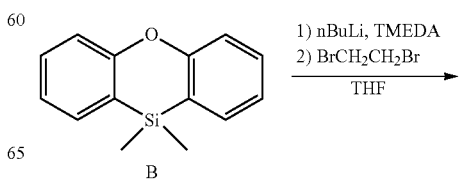

7. Synthesis of Compound 23

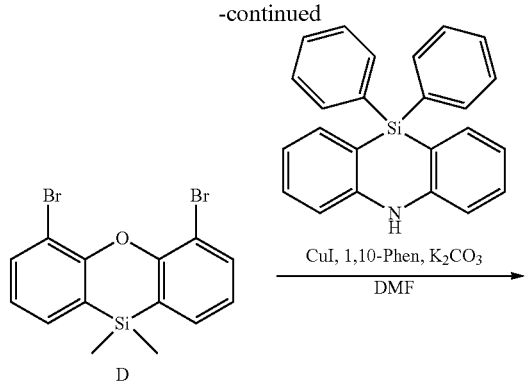

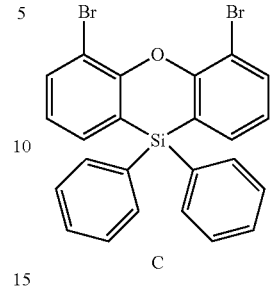

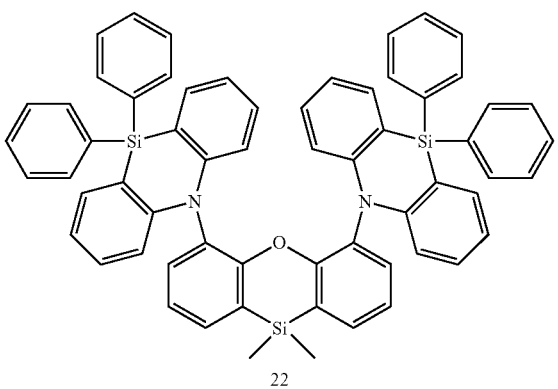

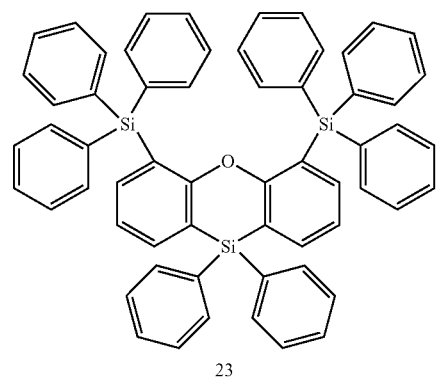

Under an argon (Ar) atmosphere, 5.0 g of Compound B and 5.1 mL of TMEDA were dissolved in 150 mL of dehydrated THF in a 500 mL three neck flask, and n-BuLi (1.6 M in hexane, 21.2 mL) was added thereto dropwisely at 0° C. After stirring at room temperature for about 16 hours, 4.0 mL of 1,2-dibromoethane was added thereto dropwisely at −78° C. The resultant was stirred for about 2 hours so that the temperature was elevated to room temperature, and then further stirred at room temperature for about 12 hours. After adding water and $CH_2Cl_2$ to the reactant, an organic layer was separated and dried over $MgSO_4$, and solvents were evaporated under reduced pressure. The crude product thus obtained was purified by silica gel column chromatography to obtain 3.8 g (yield 65%) of Compound D. The molecular weight of Compound D measured by FAB-MS was 384.

Under an argon (Ar) atmosphere, 3.5 g of Compound D, 6.4 g of 10,10-diphenyl-5,10-dihydrodibenzo[b,e][1,4]azasiline, 0.17 g of CuI, 0.32 g of 1,10-phenanthroline and 5.0 g of $K_2CO_3$ were injected to a 500 mL three neck flask, and the mixture in 90 mL of DMF was heated and stirred at 100° C. for about 10 hours. After cooling in the air, the resultant was added with water and $CH_2Cl_2$. An organic layer was separated and dried with $MgSO_4$, and solvents were evaporated under reduced pressure. The crude product thus obtained was purified by silica gel column chromatography to obtain 5.0 g (yield 60%) of Compound 22. The molecular weight of Compound 22 measured by FAB-MS was 921.

Under an argon (Ar) atmosphere, 3.5 g of Compound C was dissolved in 100 mL of dehydrated THF in a 500 mL three neck flask, and n-BuLi (1.6 M in hexane, 8.6 mL) was added thereto dropwisely at −78° C. After stirring at −78° C. for about 2 hours, 4.1 g of triphenylchlorosilane dissolved in 50 mL of dehydrated THF was added thereto dropwisely. The resultant was stirred for about 2 hours so that the temperature was elevated to room temperature. After adding water and $CH_2Cl_2$ to the reactant, an organic layer was separated and dried over $MgSO_4$, and solvents were evaporated under reduced pressure. The crude product thus obtained was purified by silica gel column chromatography to obtain 4.0 g (yield 68%) of Compound 23. The molecular weight of Compound 23 measured by FAB-MS was 867.

Device Manufacturing Example 1

Organic electroluminescence devices of Examples 1 to 7 were manufactured by utilizing the above Compounds 1, 2, 5, 13, 17, 22 and 23 as emission layer materials, respectively.

Example Compounds
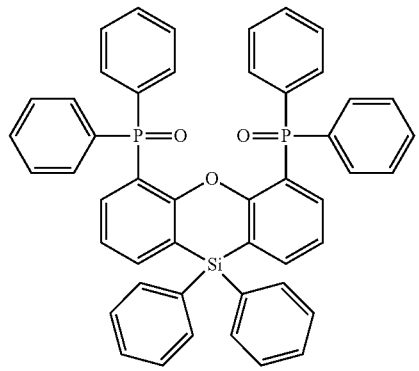
1
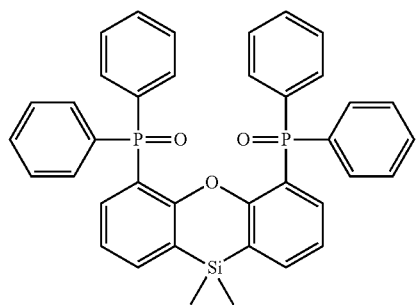
2
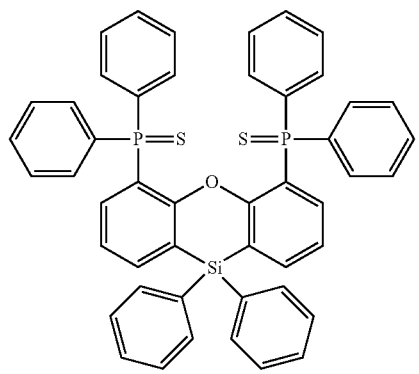
5
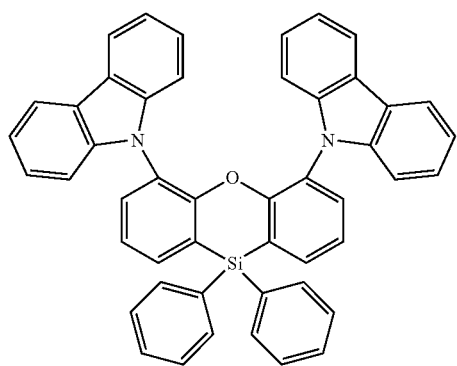
13
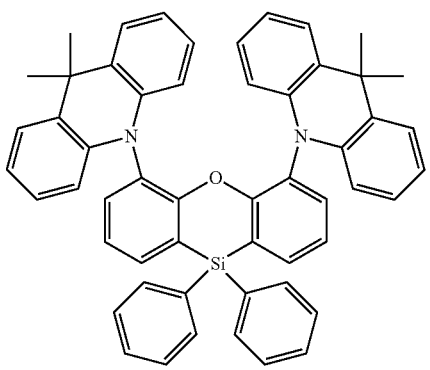
17
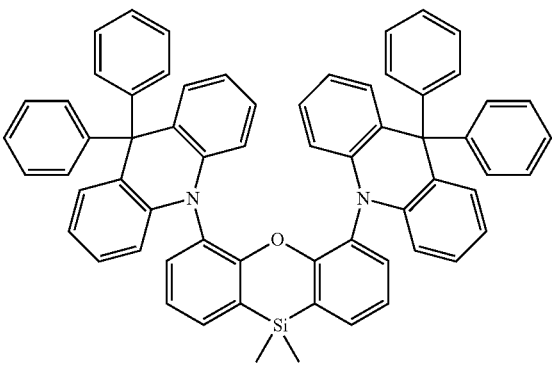
22
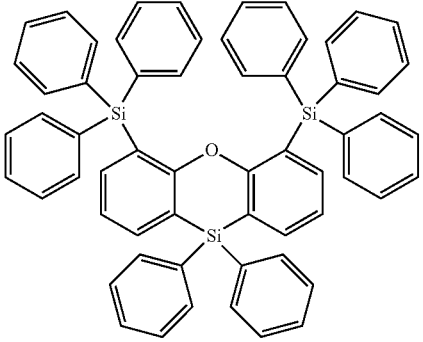
23
Organic electroluminescent devices of Comparative Examples 1 to 5 were manufactured by utilizing the following Comparative Compounds DPEPO, X-1, X-2, X-3 and X-4 as emission layer materials, respectively.
Comparative Compounds
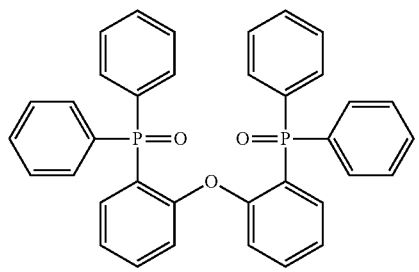
DPEPO -continued X-1
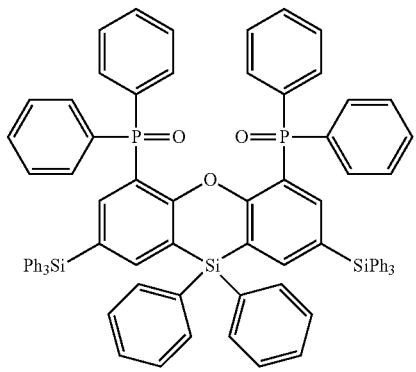

X-2
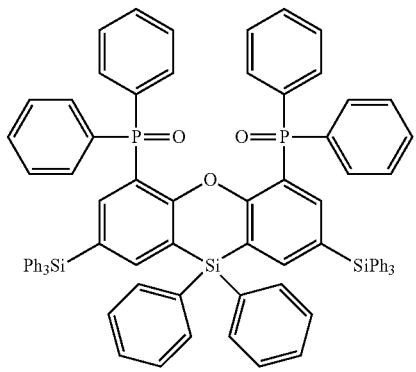

X-3
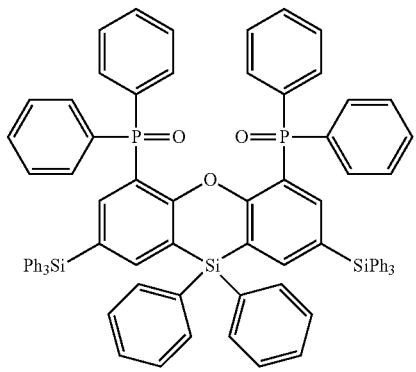

X-4
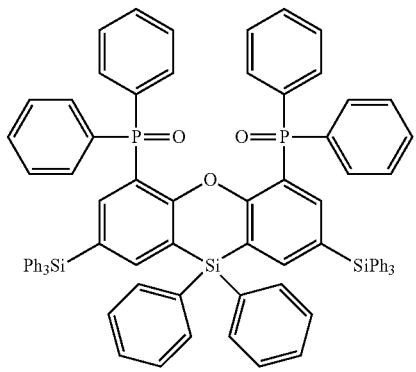

The organic electroluminescence devices according to Examples 1 to 7 and Comparative Examples 1 to 5 were manufactured by forming a first electrode utilizing ITO to a thickness of about 150 nm, a hole injection layer utilizing HAT-CN to a thickness of about 10 nm, a first hole transport layer utilizing α-NPD to a thickness of about 80 nm, a second hole transport layer utilizing mCP to a thickness of about 5 nm, an emission layer utilizing the example compounds or the comparative compounds doped with 18% ACRSA to a thickness of about 20 nm, a first electron transport layer utilizing DPEPO to a thickness of about 10 nm, a second electron transport layer utilizing TPBi to a thickness of about 30 nm, an electron injection layer utilizing LiF to a thickness of about 0.5 nm, and a second electrode utilizing Al to a thickness of about 100 nm. Each layer was formed by a vacuum deposition method.

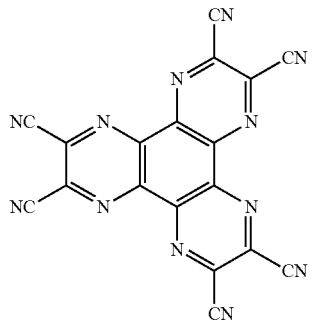
HAT-CN

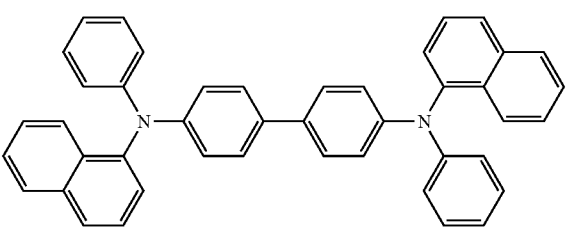
α-NPD

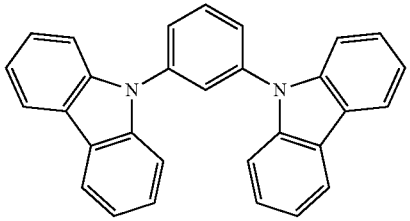
mCP

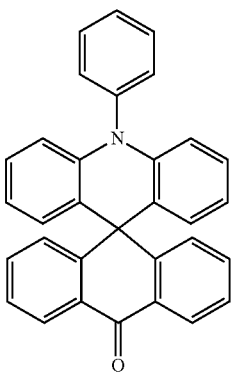
ACRSA

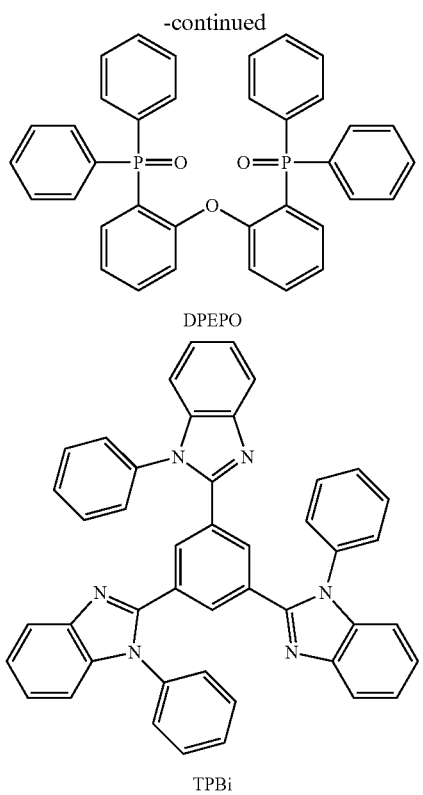

DPEPO

TPBi

The above materials, HAT-CN, α-NPD, mCP, DPEPO, TPBi, and ACRSA, are known compounds. Commercially available products were utilized after being purified by sublimation process.

TABLE 1

| | Emission layer host | Maximum emission efficiency | Half life |
|---|---|---|---|
| Example 1 | Example Compound 1 | 115% | 220% |
| Example 2 | Example Compound 2 | 115% | 200% |
| Example 3 | Example Compound 5 | 115% | 210% |
| Example 4 | Example Compound 13 | 105% | 260% |
| Example 5 | Example Compound 17 | 110% | 190% |
| Example 6 | Example Compound 22 | 115% | 200% |
| Example 7 | Example Compound 23 | 110% | 200% |
| Comparative Example 1 | DPEPO | 100% | 100% |
| Comparative Example 2 | Comparative Compound X-1 | 100% | 80% |
| Comparative Example 3 | Comparative Compound X-2 | 100% | 90% |
| Comparative Example 4 | Comparative Compound X-3 | 90% | 70% |
| Comparative Example 5 | Comparative Compound X-4 | 90% | 40% |

The emission property of the manufactured organic electroluminescence devices was evaluated by utilizing a brightness light distribution characteristics measurement system C9920-11 (Hamamatsu Photonics, Japan) and the results are summarized in Table 1.

Referring to the results in Table 1, it may be found that the heterocyclic compound according to an embodiment of the present disclosure has an effect of improving the emission efficiency of the device and extending the device life, when utilized as host materials of the emission layer. Specifically, the organic electroluminescence devices of Examples 1 to 7 have high efficiency and extended life compared with that of Comparative Example 1, due to the enhanced stability of the compounds and enhanced charge-transfer by the cross-linking of the diphenylether moiety of DPEPO with the silicon atom. Although Comparative Compounds X-1 to X-3 utilized in Comparative Examples 2 to 4 have a silicon atom cross-linkage, Comparative Compound X-1 of Comparative Example 2 has high molecular weight, so that the decomposition product might contaminate the deposited material, thereby decreasing the efficiency and device life. In Comparative Compound X-2 of Comparative Example 3, a nitrogen atom is located at the meta position of the oxygen atom in dibenzooxasiline (para position of Si atom), which decreases the charge tolerance of dibenzooxasiline, thereby decreasing the efficiency and device life. In Comparative Compound X-3 of Comparative Example 4, low charge tolerance of diphenylamine results in decreased device life. In Comparative Compound X-4 of Comparative Example 5, low stability of Si—Si bonding decreases the device life, and the dibenzooxasiline moiety has no substituent such as those represented by Formulae 2 to 4, thereby decreasing the efficiency property due to insufficient charge transfer.

According to the above results, it may be found that in the heterocyclic compound according to an embodiment of the present disclosure, a substituent is introduced into an ortho position of oxygen atom in dibenzooxasiline, which does not decrease the stability of dibenzooxasiline, thereby attaining high efficiency and long life effect of an organic electroluminescence device including the heterocyclic compound.

Device Manufacturing Example 2

The organic electroluminescence devices according to Examples 8 to 11 and Comparative Examples 6 to 10 were manufactured by forming a first electrode utilizing ITO to a thickness of about 150 nm, a hole injection layer utilizing HAT-CN to a thickness of about 10 nm, a first hole transport layer utilizing α-NPD to a thickness of about 80 nm, a second hole transport layer utilizing mCP to a thickness of about 5 nm, an emission layer utilizing DPEPO doped with 18% ACRSA to a thickness of about 20 nm, a first electron transport layer utilizing the example compounds or the comparative compounds to a thickness of about 10 nm, a second electron transport layer utilizing TPBi to a thickness of about 30 nm, an electron injection layer utilizing LiF to a thickness of about 0.5 nm, and a second electrode utilizing Al to a thickness of about 100 nm. Each layer was formed by a vacuum deposition method.

TABLE 2

| | First electron transport layer | Maximum emission efficiency | Half life |
|---|---|---|---|
| Example 8 | Example Compound 1 | 120% | 230% |
| Example 9 | Example Compound 2 | 120% | 210% |
| Example 10 | Example Compound 5 | 120% | 200% |
| Example 11 | Example Compound 23 | 115% | 200% |
| Comparative Example 6 | DPEPO | 100% | 100% |
| Comparative Example 7 | Comparative Compound X-1 | 100% | 90% |
| Comparative Example 8 | Comparative Compound X-2 | 70% | 70% |
| Comparative Example 9 | Comparative Compound X-3 | 70% | 60% |
| Comparative Example 10 | Comparative Compound X-4 | 65% | 40% |

The emission property of the manufactured organic electroluminescence devices was evaluated by utilizing a brightness light distribution characteristics measurement system C9920-11 (Hamamatsu Photonics, Japan) and the results are summarized in Table 2.

Device Manufacturing Example 3

The organic electroluminescence devices according to Examples 12 to 14 and Comparative Examples 11 to 15 were manufactured by forming a first electrode utilizing ITO to a thickness of about 150 nm, a hole injection layer utilizing HAT-CN to a thickness of about 10 nm, a first hole transport layer utilizing α-NPD to a thickness of about 80 nm, a second hole transport layer utilizing the example compounds or the comparative compounds to a thickness of about 5 nm, an emission layer utilizing DPEPO doped with 18% ACRSA to a thickness of about 20 nm, a first electron transport layer utilizing DPEPO to a thickness of about 10 nm, a second electron transport layer utilizing TPBi to a thickness of about 30 nm, an electron injection layer utilizing LiF to a thickness of about 0.5 nm, and a second electrode utilizing Al to a thickness of about 100 nm. Each layer was formed by a vacuum deposition method.

TABLE 3

| | Second hole transport layer | Maximum emission efficiency | Half life |
|---|---|---|---|
| Example 12 | Example Compound 13 | 120% | 130% |
| Example 13 | Example Compound 17 | 115% | 110% |
| Example 14 | Example Compound 22 | 115% | 120% |
| Comparative Example 11 | mCP | 100% | 100% |
| Comparative Example 12 | Comparative Compound X-1 | 60% | 50% |
| Comparative Example 13 | Comparative Compound X-2 | 100% | 90% |
| Comparative Example 14 | Comparative Compound X-3 | 95% | 90% |
| Comparative Example 15 | Comparative Compound X-4 | 85% | 50% |

The emission property of the manufactured organic electroluminescence devices was evaluated by utilizing a brightness light distribution characteristics measurement system C9920-11 (Hamamatsu Photonics, Japan) and the results are summarized in Table 3.

Referring to the results in Tables 2 and 3, it may be found that the heterocyclic compound according to an embodiment of the present disclosure may be utilized as a hole transport material or an electron transport material, and has an effect of improving the emission efficiency of the device and extending a device life.

The heterocyclic compound according to an embodiment of the present disclosure may be utilized as a material for an organic electroluminescence device, for example, as an emission material, a hole transport material, or an electron transport material.

The organic electroluminescence device including the heterocyclic compound according to an embodiment of the present disclosure has excellent efficiency and long life.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed, and equivalents thereof.

What is claimed is:
1. A heterocyclic compound represented by following Formula 1:

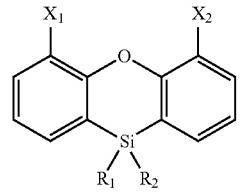

Formula 1 wherein in Formula 1,
$R_1$ and $R_2$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
$X_1$ and $X_2$ are each independently represented by any one of following Formulae 2 to 4:

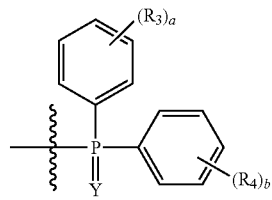

Formula 2

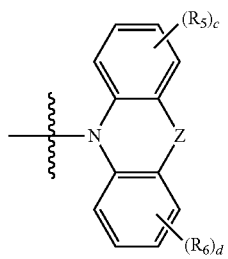

Formula 3

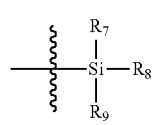

Formula 4 wherein in Formulae 2 to 4,
Y is O or S,
Z is a direct linkage, $CR_{10}R_{11}$, or $SiR_{12}R_{13}$,
$R_3$ to $R_{13}$ are each independently hydrogen, deuterium, a halogen atom, a cyano group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
a and b are each independently an integer of 0 to 5, and
c and d are each independently an integer of 0 to 4.
2. The heterocyclic compound of claim 1, wherein $R_1$ and $R_2$ are the same as each other.
3. The heterocyclic compound of claim 1, wherein $R_1$ and $R_2$ are each independently a substituted or unsubstituted alkyl group having 1 to 6 carbon atoms, or a substituted or unsubstituted phenyl group.

4. The heterocyclic compound of claim 1, wherein $X_1$ and $X_2$ are the same as each other.

5. The heterocyclic compound of claim 1, wherein $X_1$ and $X_2$ are each independently represented by Formula 2.

6. The heterocyclic compound of claim 1, wherein $X_1$ and $X_2$ are each independently represented by any one of following Formulae 3-1 to 3-5:

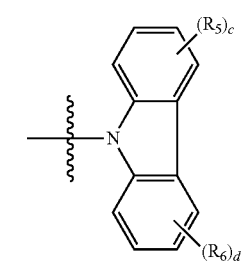

Formula 3-1

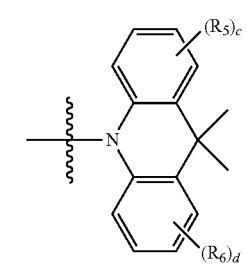

Formula 3-2

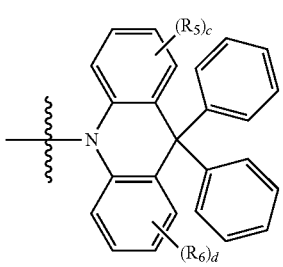

Formula 3-3

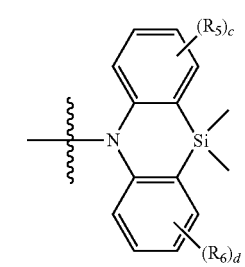

Formula 3-4

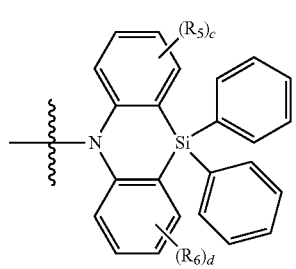

Formula 3-5 where $R_5$, $R_6$, c and d are the same as defined in Formula 3.

7. The heterocyclic compound of claim 1, wherein $X_1$ and $X_2$ are each independently represented by any one of following Formulae 4-1 to 4-5:

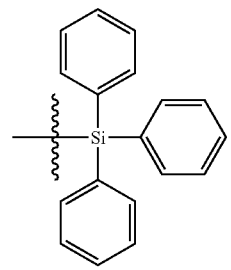

Formula 4-1

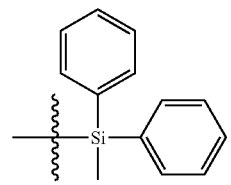

Formula 4-2

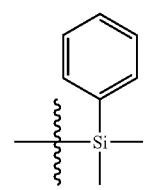

Formula 4-3

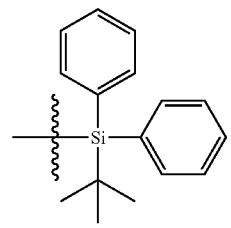

Formula 4-4

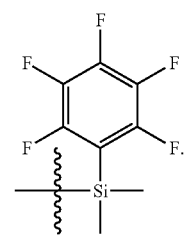

Formula 4-5

8. The heterocyclic compound of claim 1, wherein the heterocyclic compound represented by Formula 1 is any one selected from the group consisting of compounds represented in the following Compound Group 1:

Compound Group 1
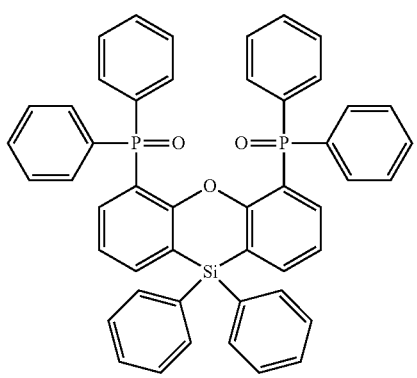
1
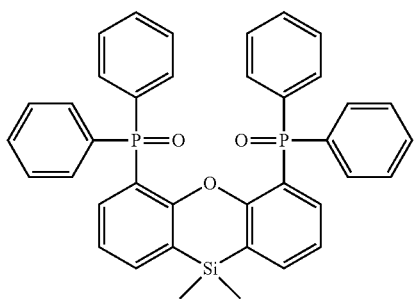
2
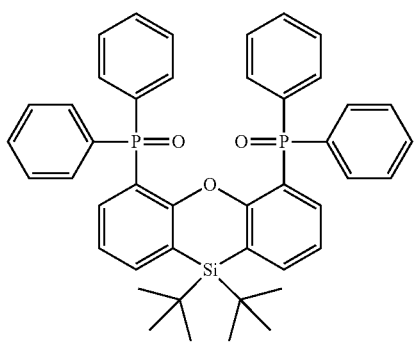
3
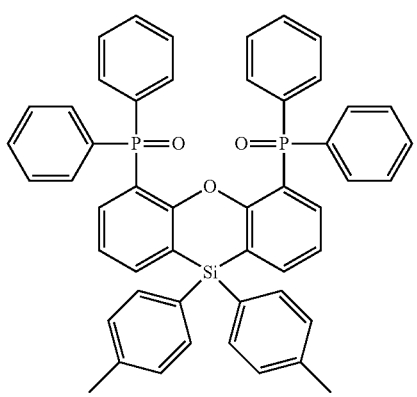
4
-continued
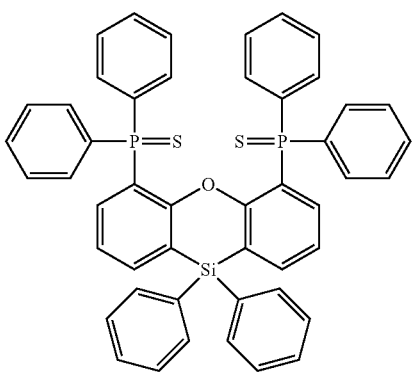
5
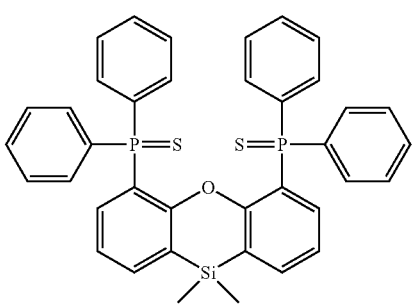
6
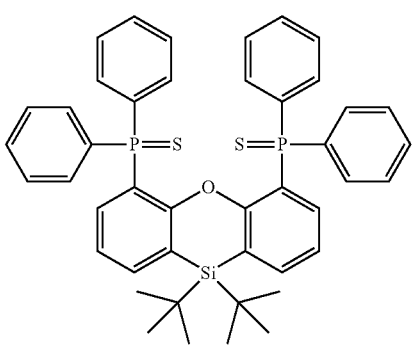
7
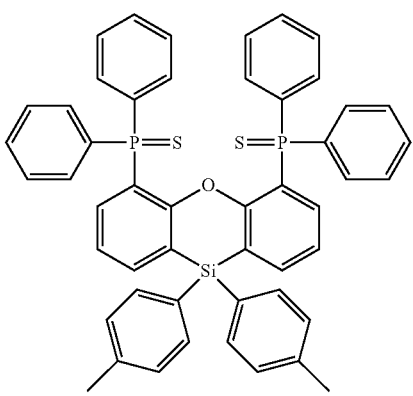
8

-continued
9
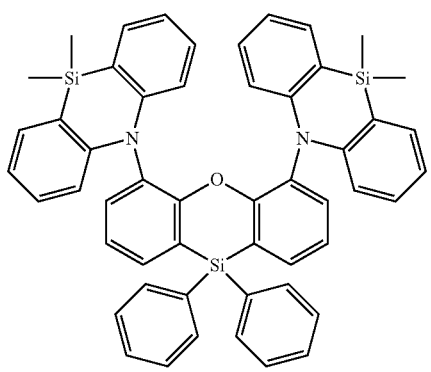
10
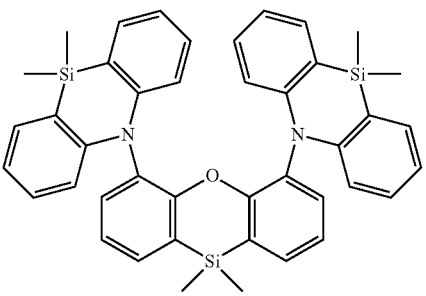
11
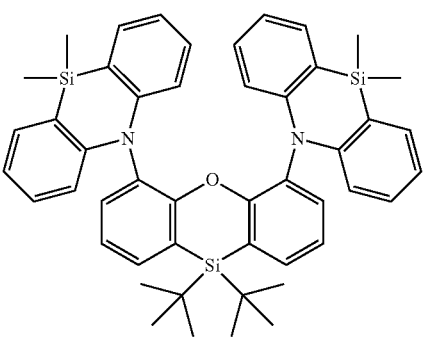
12
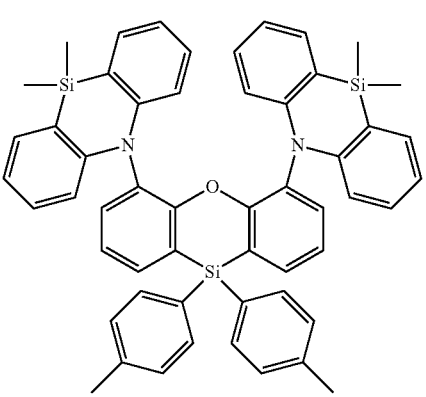
-continued
13
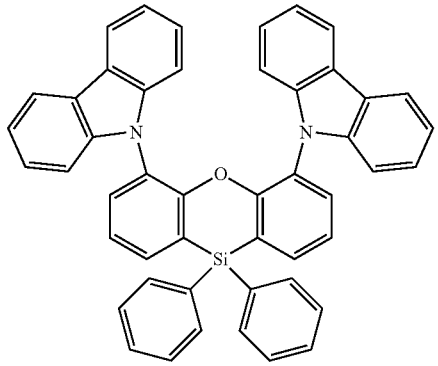
14
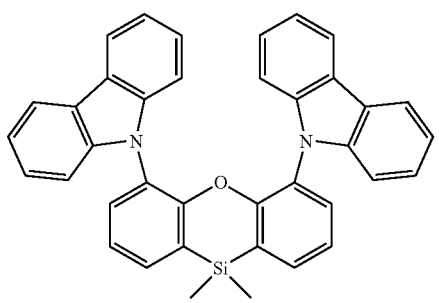
15
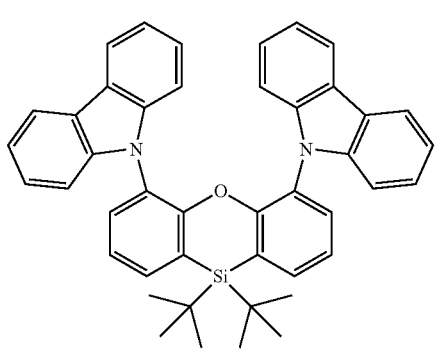
16
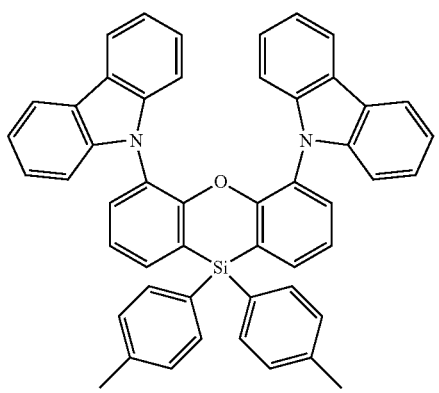

17
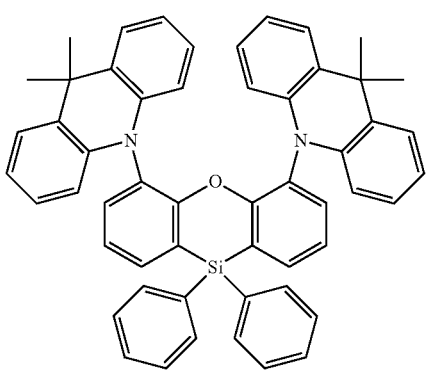
18
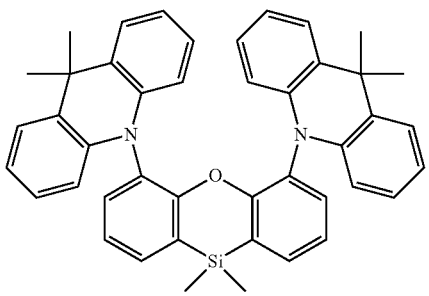
19
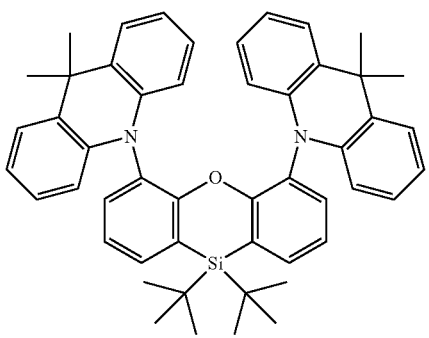
20
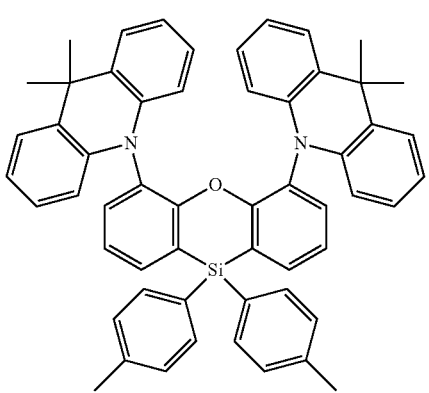
21
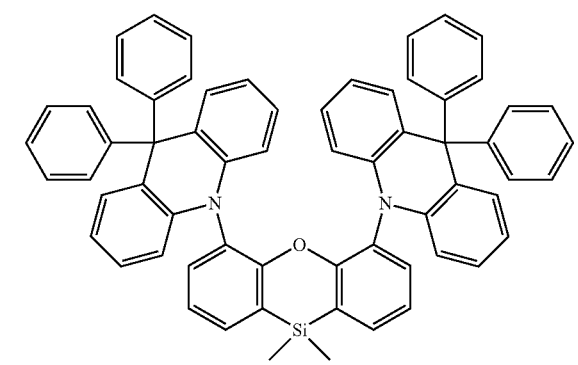
22
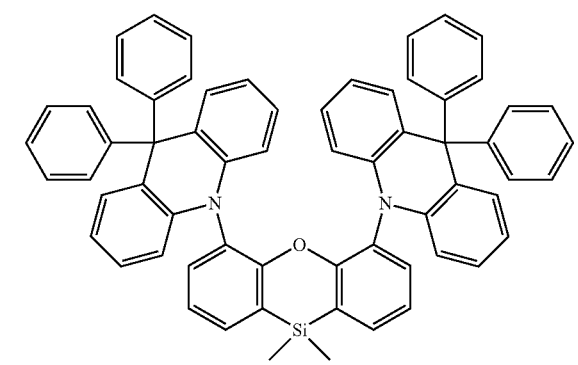
23
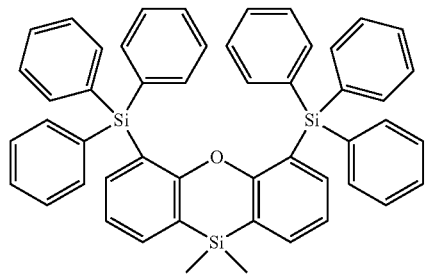
24
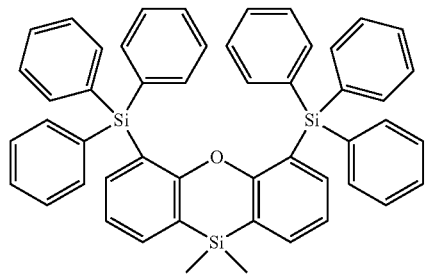

25
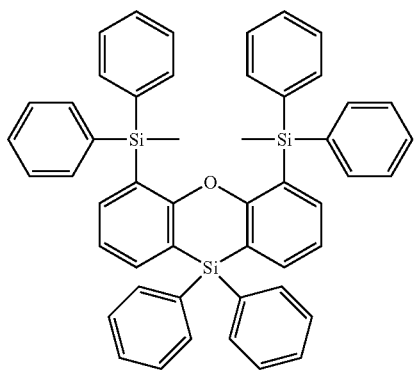

26
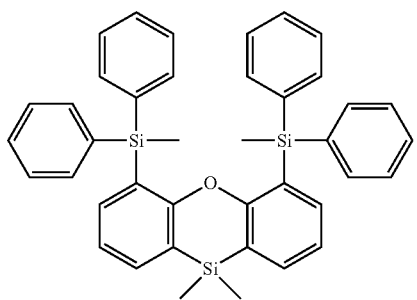

27
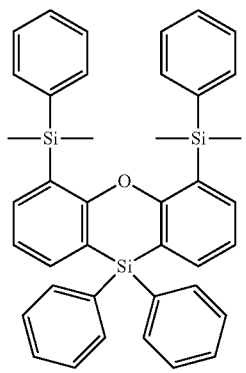

28
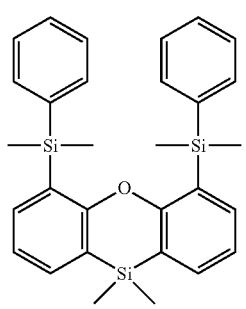

29
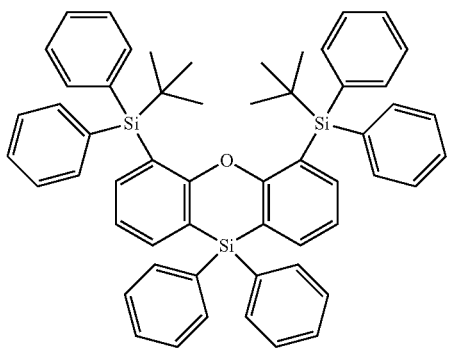

30
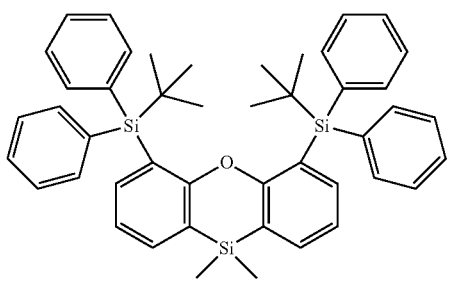

31
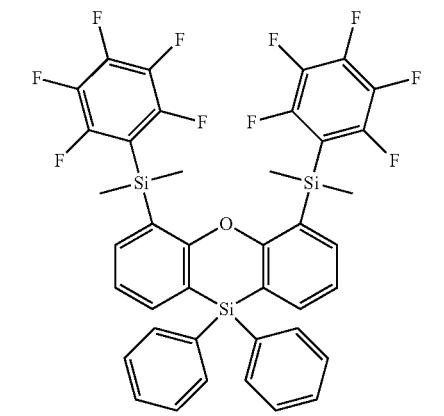

32
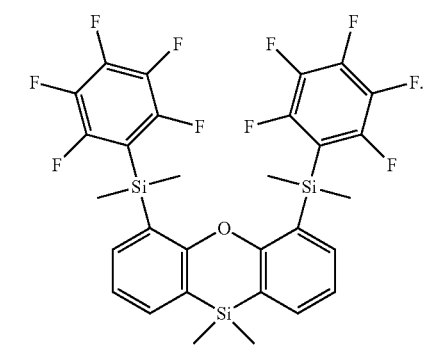

9. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from AQ, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof, and wherein at least one of the hole transport region, the emission layer, or the electron transport region comprises a heterocyclic compound represented by following Formula 1:

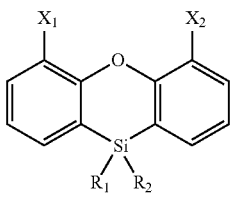

Formula 1 wherein in Formula 1,

R₁ and R₂ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, X₁ and X₂ are each independently represented by any one of following Formulae 2 to 4:

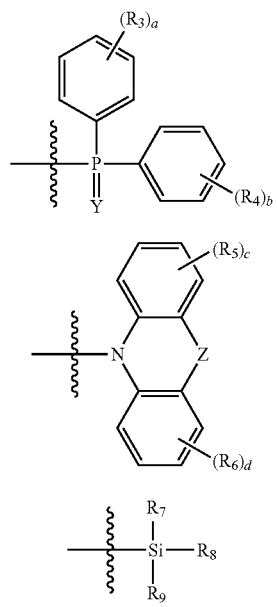

Formula 2

Formula 3

Formula 4 wherein in Formulae 2 to 4,
Y is O or S,
Z is a direct linkage, CR₁₀R₁₁, or SiR₁₂R₁₃,
R₃ to R₁₃ are each independently hydrogen, deuterium, a halogen atom, a cyano group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
a and b are each independently an integer of 0 to 5, and
c and d are each independently an integer of 0 to 4.

10. The organic electroluminescence device of claim 9, wherein the emission layer comprises the heterocyclic compound represented by Formula 1.

11. The organic electroluminescence device of claim 9, wherein the hole transport region comprises a plurality of layers, and a layer of the plurality of layers contacting with the emission layer comprises the heterocyclic compound represented by Formula 1.

12. The organic electroluminescence device of claim 9, wherein the electron transport region comprises a plurality of layers, and a layer of the plurality of layers contacting with the emission layer comprises the heterocyclic compound represented by Formula 1.

13. The organic electroluminescence device of claim 9, wherein R₁ and R₂ are the same as each other.

14. The organic electroluminescence device of claim 9, wherein R₁ and R₂ are each independently a substituted or unsubstituted alkyl group having 1 to 6 carbon atoms, or a substituted or unsubstituted phenyl group.

15. The organic electroluminescence device of claim 9, wherein X₁ and X₂ are the same as each other.

16. The organic electroluminescence device of claim 9, wherein X₁ and X₂ are each independently represented by Formula 2.

17. The organic electroluminescence device of claim 9, wherein X₁ and X₂ are each independently represented by any one of following Formulae 3-1 to 3-5:

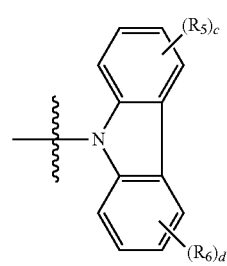

Formula 3-1

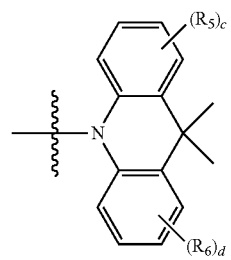

Formula 3-2

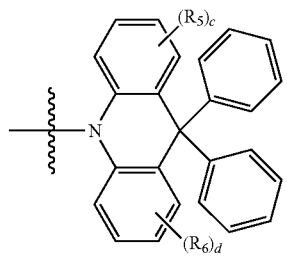

Formula 3-3

-continued

Formula 3-4

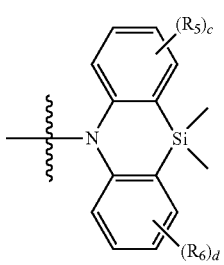

Formula 3-5

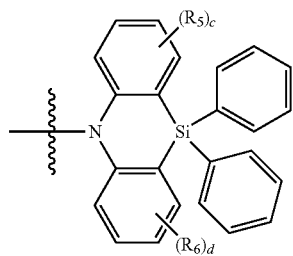

where $R_5$, $R_6$, c and d are the same as defined in Formula 3.

18. The organic electroluminescence device of claim 9, wherein $X_1$ and $X_2$ are each independently represented by any one of following Formulae 4-1 to 4-5:

Formula 4-1

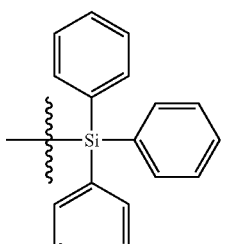

Formula 4-2

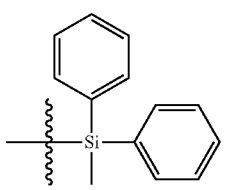

Formula 4-3

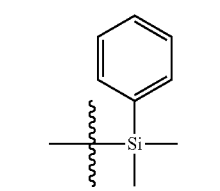

Formula 4-4

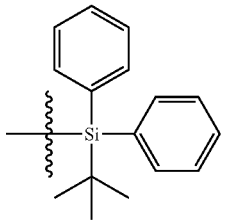

Formula 4-5

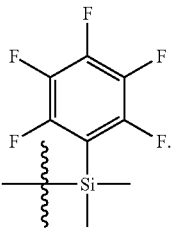

19. The organic electroluminescence device of claim 9, wherein the heterocyclic compound represented by Formula 1 is at least one selected from the group consisting of compounds represented in the following Compound Group 1:

Compound Group 1

1

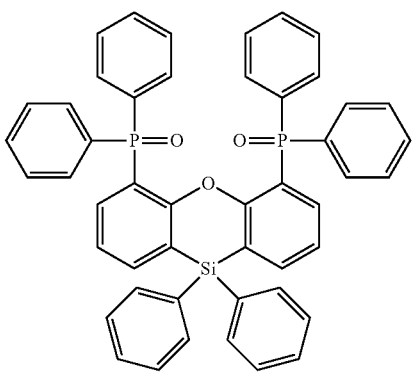

2

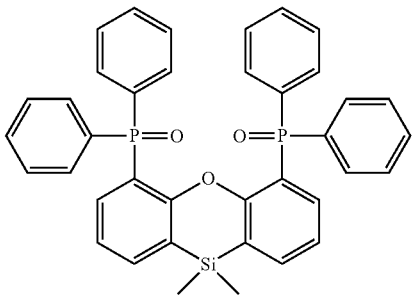

3

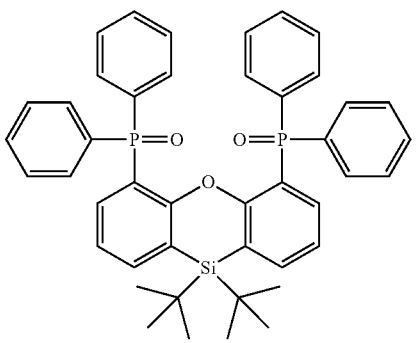

4
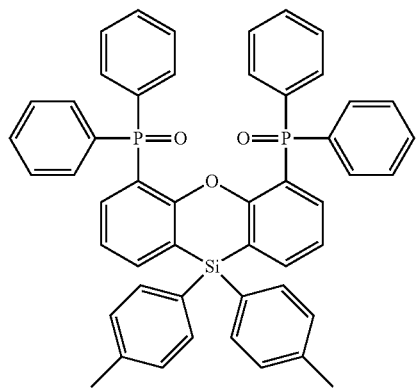
5
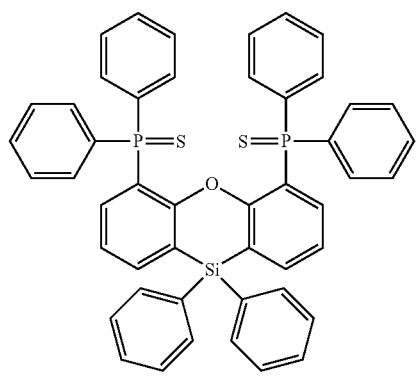
6
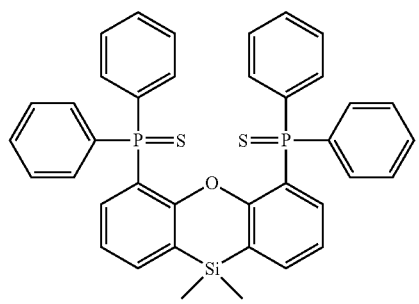
7
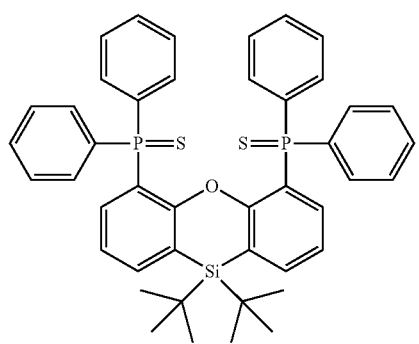
8
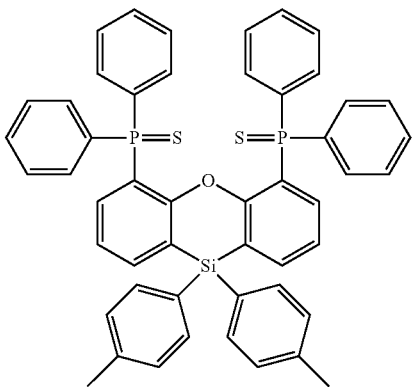
9
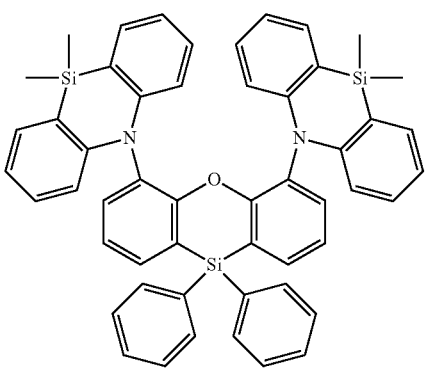
10
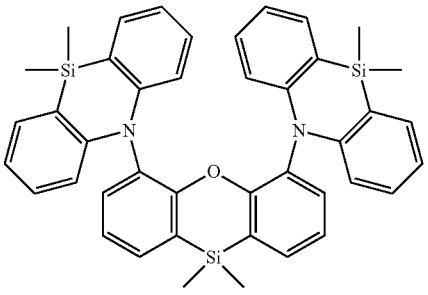
11
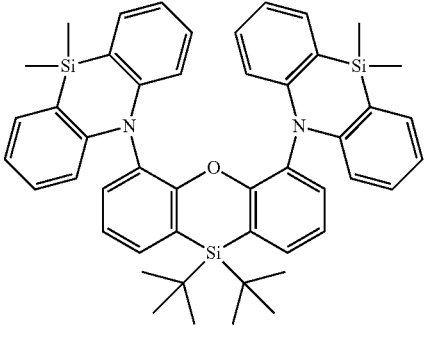

12
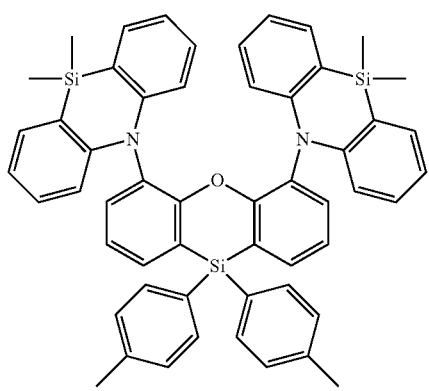
13
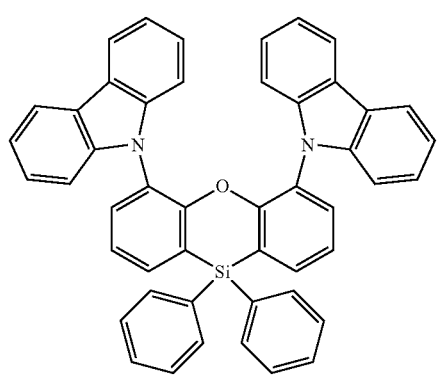
14
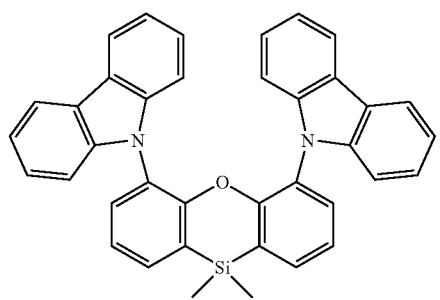
15
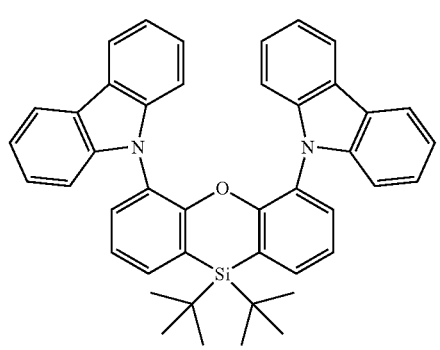
16
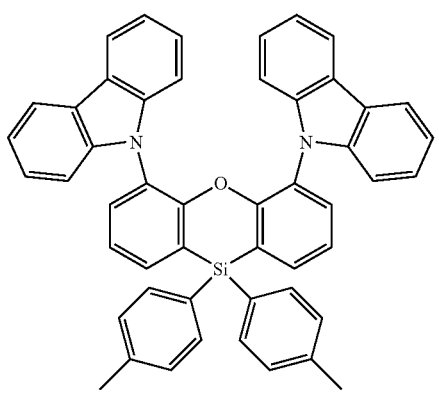
17
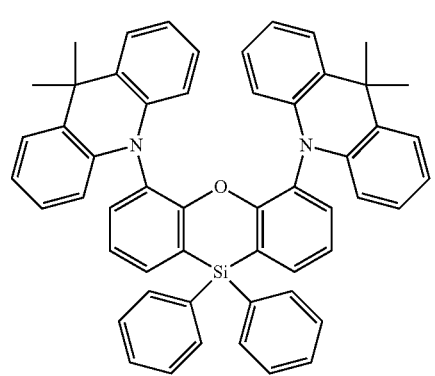
18
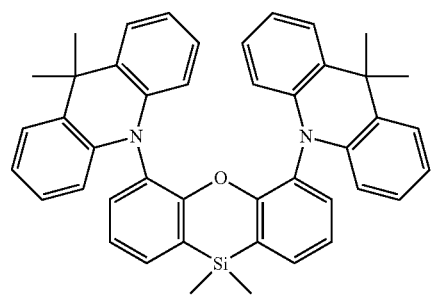
19
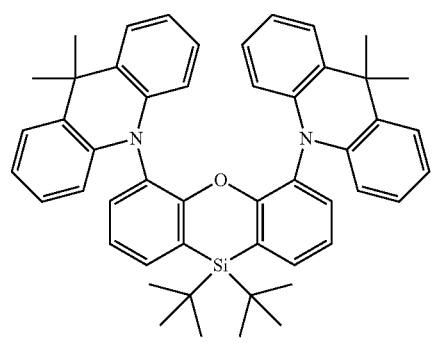

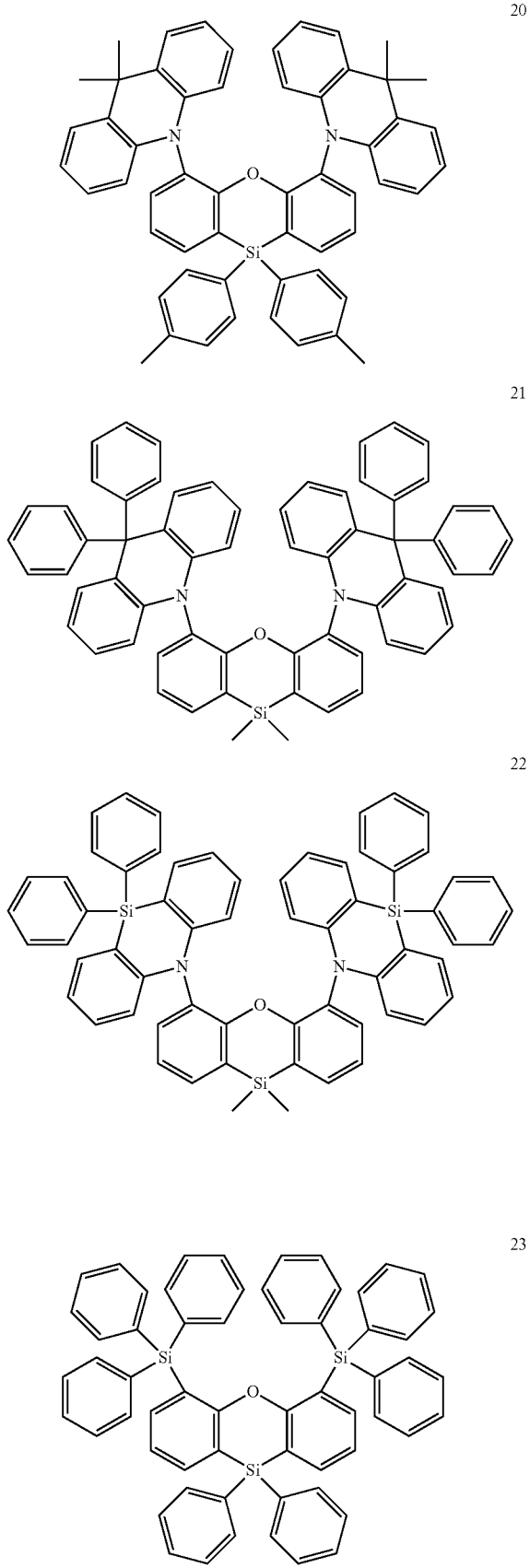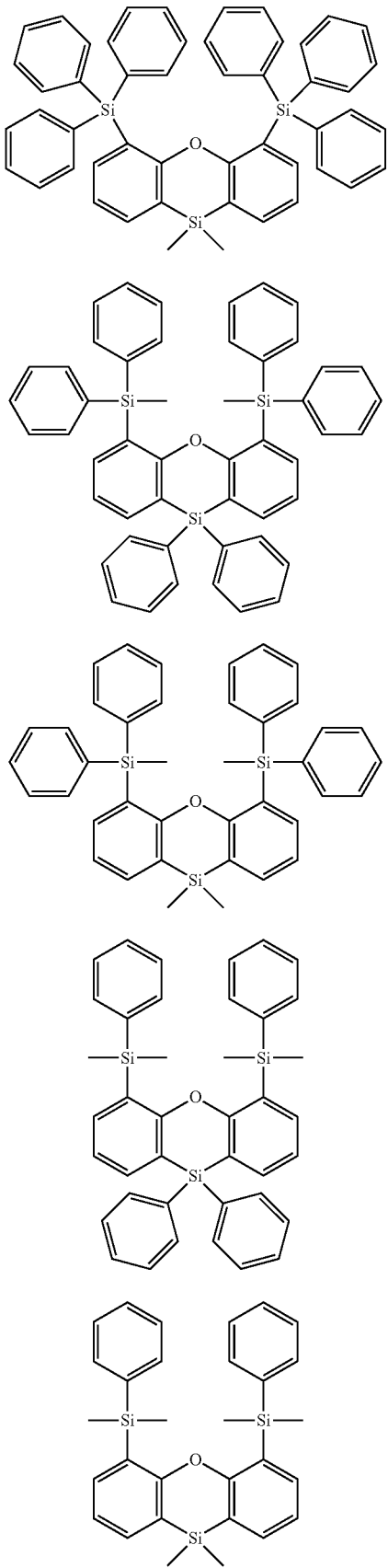

29
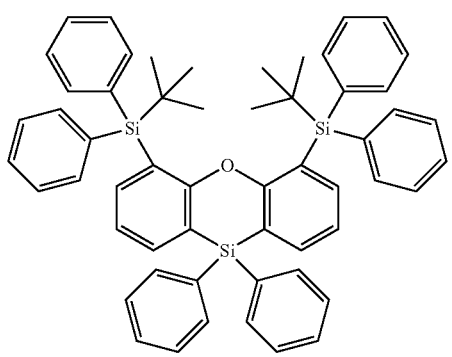
30
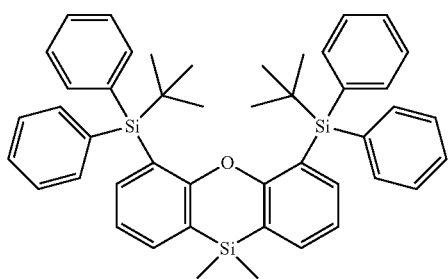
31
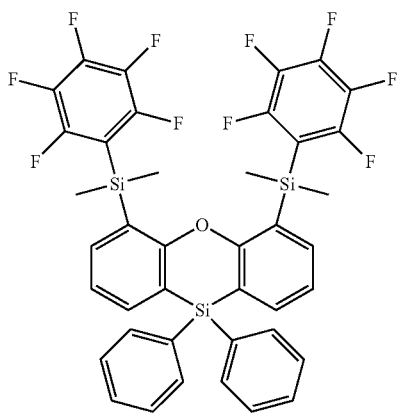
32
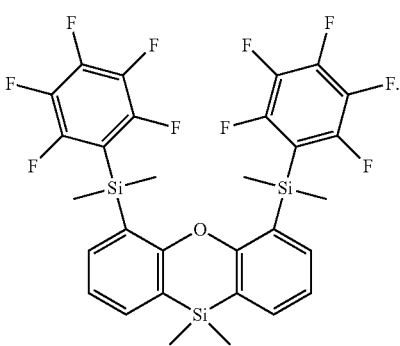
* * * * *